(12) United States Patent
Cheng

(10) Patent No.: US 7,674,672 B2
(45) Date of Patent: Mar. 9, 2010

(54) FABRICATING PROCESS FOR SUBSTRATE WITH EMBEDDED PASSIVE COMPONENT

(75) Inventor: Shih-Lian Cheng, Hsinchu (TW)

(73) Assignee: Sabtron Technology Co., Ltd., Hsinchu (TW)

( * ) Notice: Subject to any disclaimer, the term of this patent is extended or adjusted under 35 U.S.C. 154(b) by 0 days.

(21) Appl. No.: 12/358,852

(22) Filed: Jan. 23, 2009

(65) Prior Publication Data

US 2009/0280617 A1 Nov. 12, 2009

(30) Foreign Application Priority Data

May 8, 2008 (TW) .............................. 97116997 A

(51) Int. Cl.
- *H01L 21/8234* (2006.01)
- *H01L 21/8244* (2006.01)
- *H01L 21/20* (2006.01)
- *H01L 21/44* (2006.01)

(52) U.S. Cl. ...................... 438/238; 438/107; 438/109; 438/381; 438/622; 438/637; 257/E21.008; 257/E21.009; 257/E21.598; 257/E21.069; 257/E21.071

(58) Field of Classification Search .......... 257/E21.008, 257/E21.009, E21.598, E21.069, E21.071
See application file for complete search history.

(56) References Cited

U.S. PATENT DOCUMENTS

| | | | | |
|---|---|---|---|---|
| 2005/0282309 A1* | 12/2005 | Cheng | .......................... | 438/106 |
| 2006/0063301 A1* | 3/2006 | Hung et al. | .................. | 438/106 |
| 2008/0315396 A1* | 12/2008 | Kuhlman et al. | ............ | 257/692 |

* cited by examiner

*Primary Examiner*—Charles D Garber
*Assistant Examiner*—Mohsen Ahmadi
(74) *Attorney, Agent, or Firm*—J.C. Patents

(57) ABSTRACT

A fabricating process for a substrate with an embedded passive component is provided. The fabricating process includes the following steps. First, a substrate including a top conductive layer, a bottom conductive layer, and at least a dielectric layer is provided. The top conductive layer and the bottom conductive layer are separately disposed on a top surface and a bottom surface of the dielectric layer. Next, a plurality of plating through holes is formed in the substrate. Then, the top and the bottom conductive layers are patterned to form a patterned top conductive layer and a patterned bottom conductive layer separately, and the dielectric layer is exposed in part. The patterned top conductive layer and the patterned bottom conductive layer have many traces and many trenches formed by the traces. Thereafter, the trenches are filled with a material, wherein the traces and the material are adapted for forming the passive component.

24 Claims, 32 Drawing Sheets

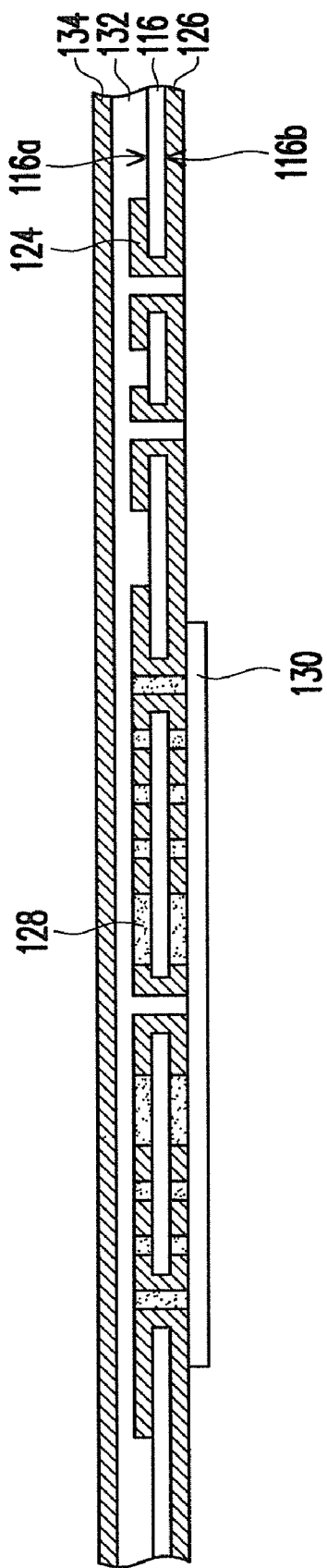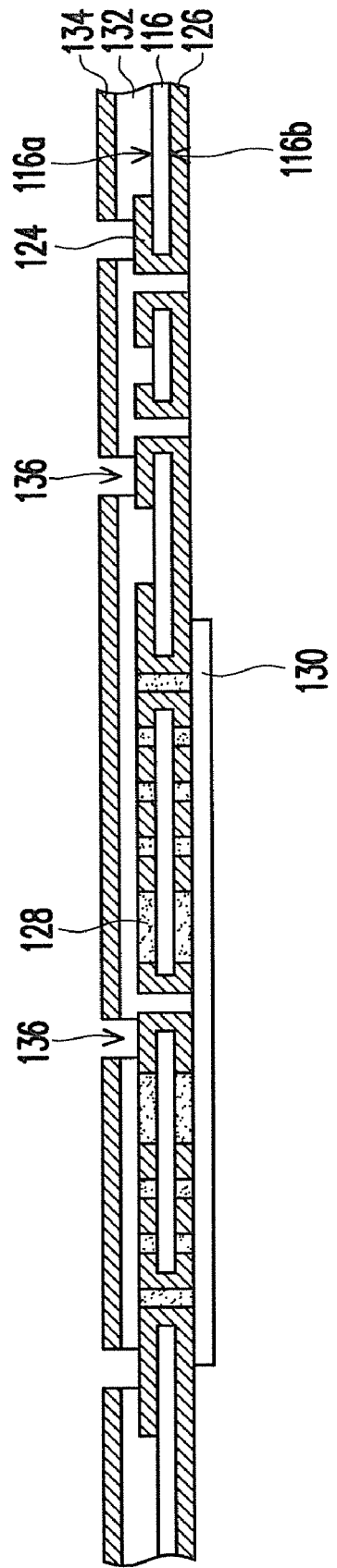

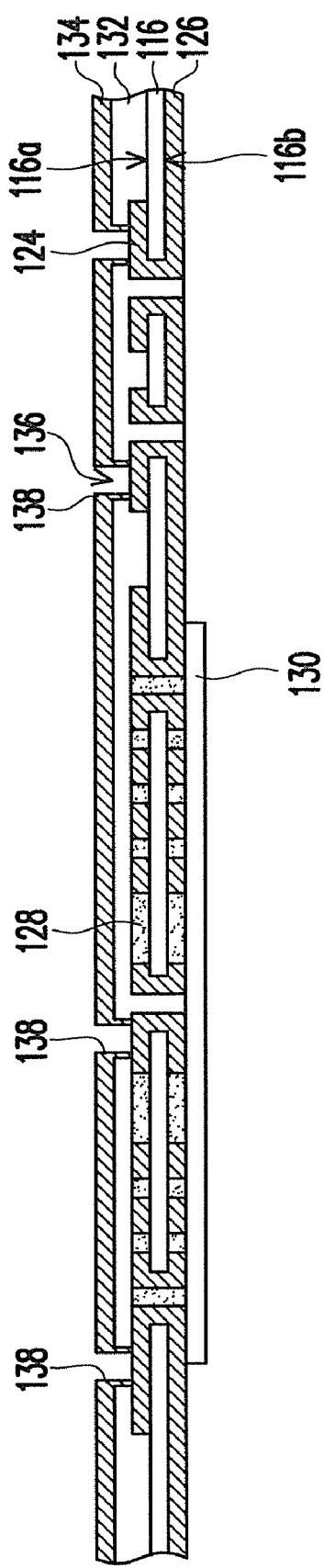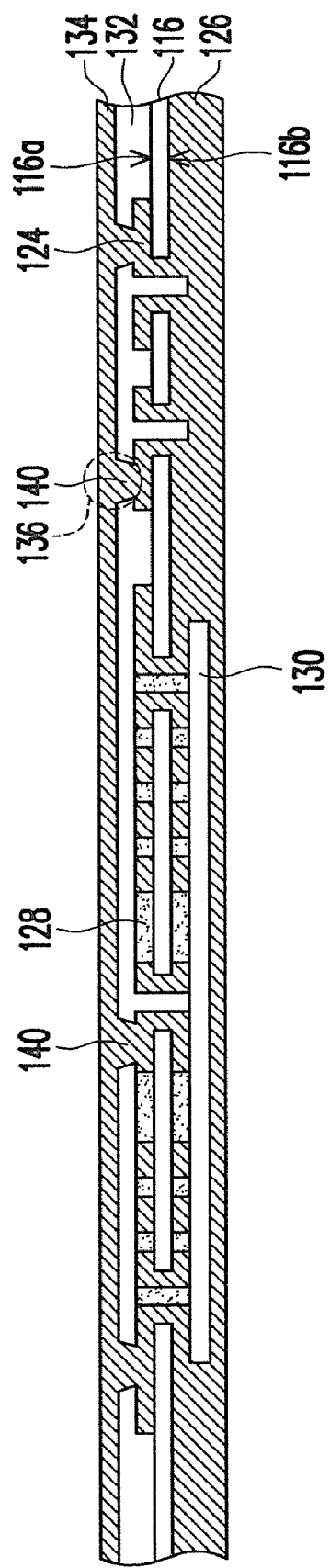
FIG. 1H
FIG. 1I

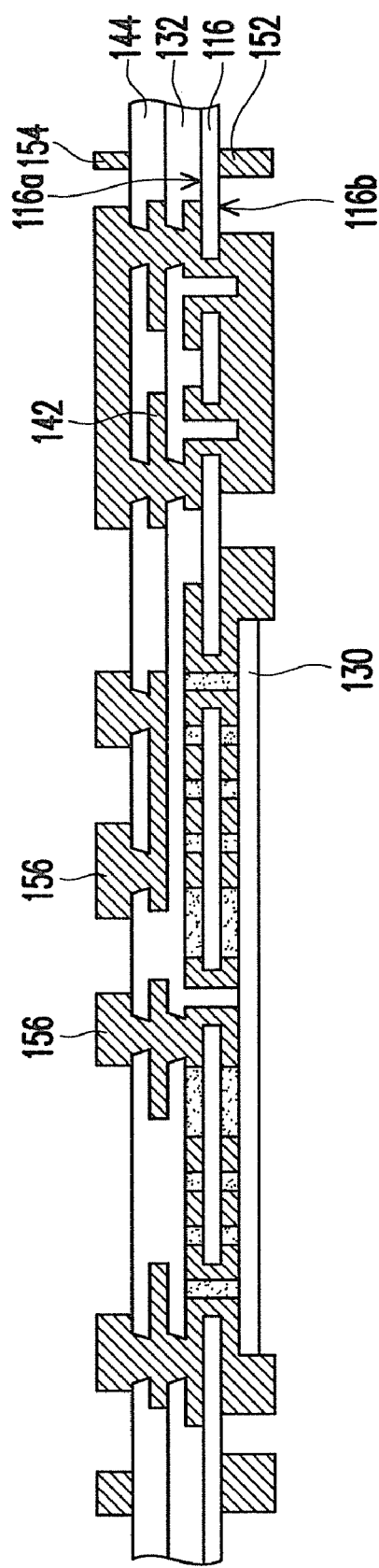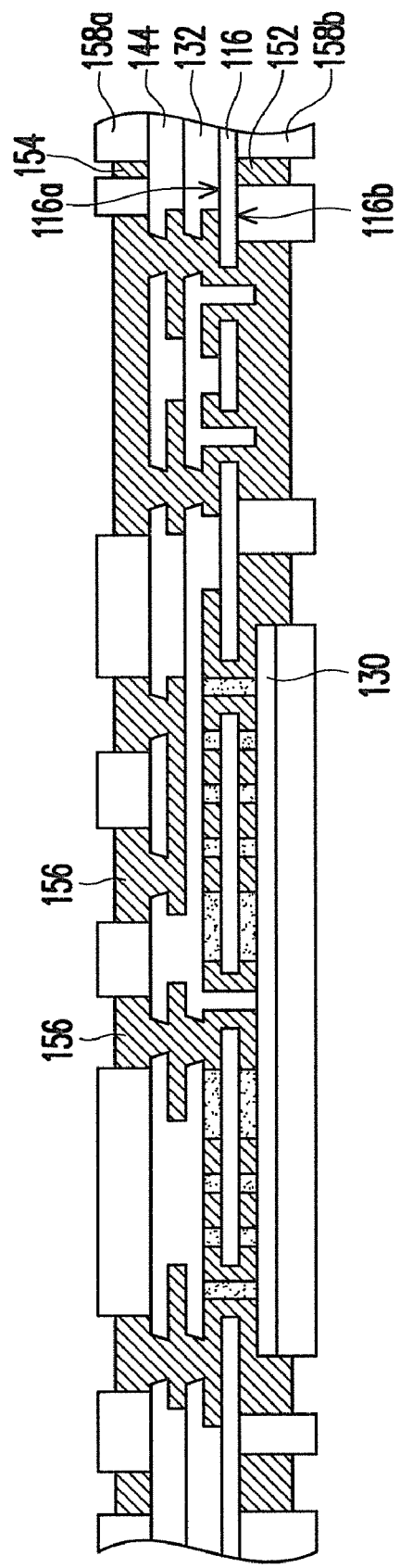

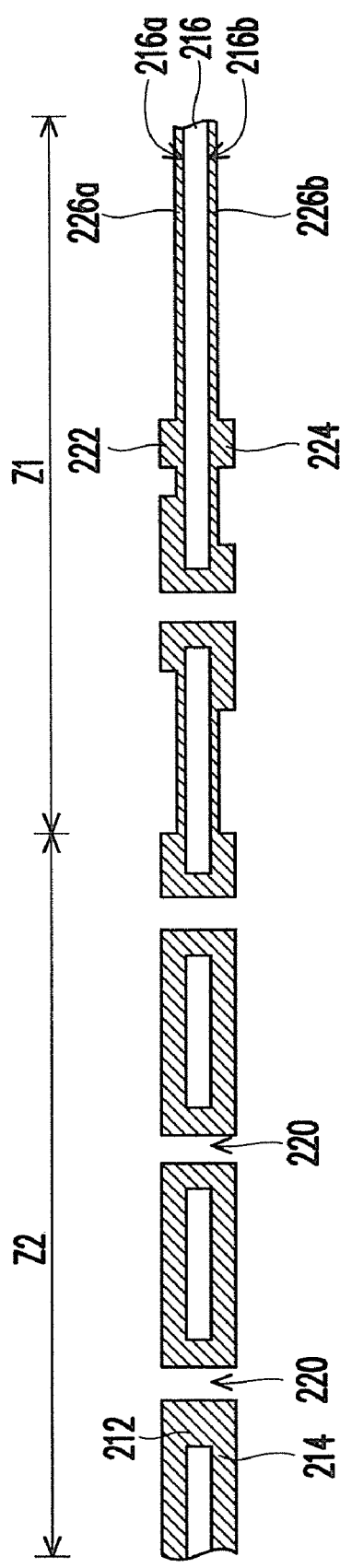
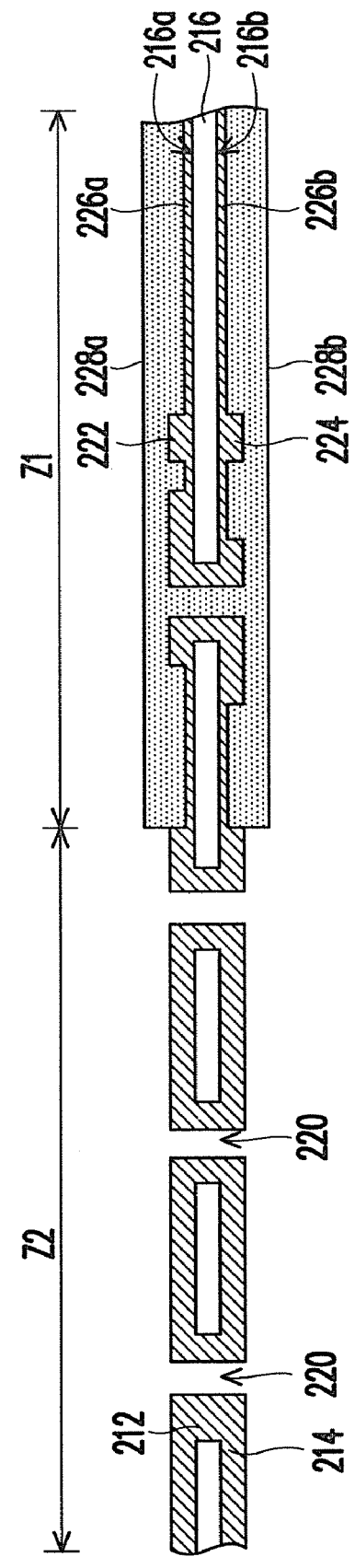
FIG. 2D
FIG. 2E

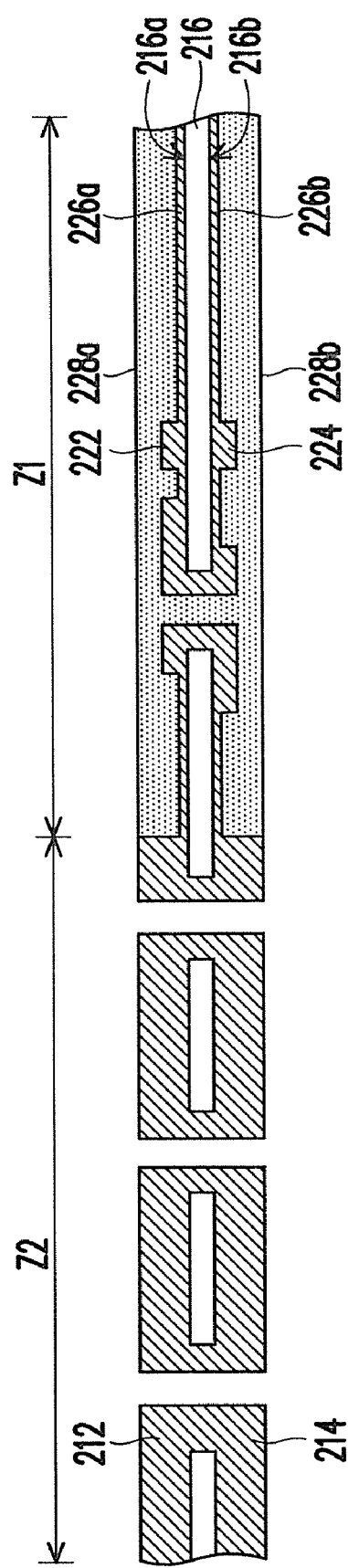
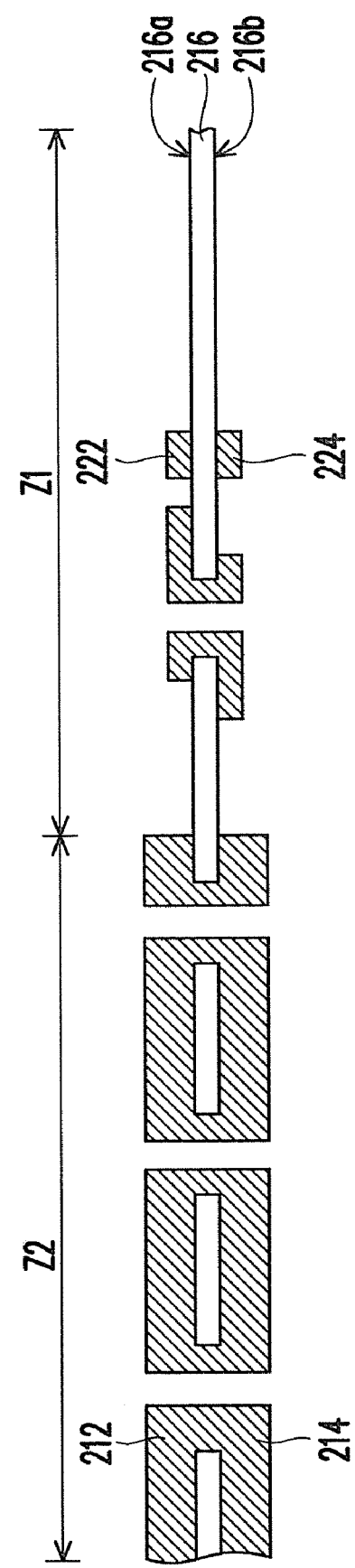
FIG. 2F
FIG. 2G

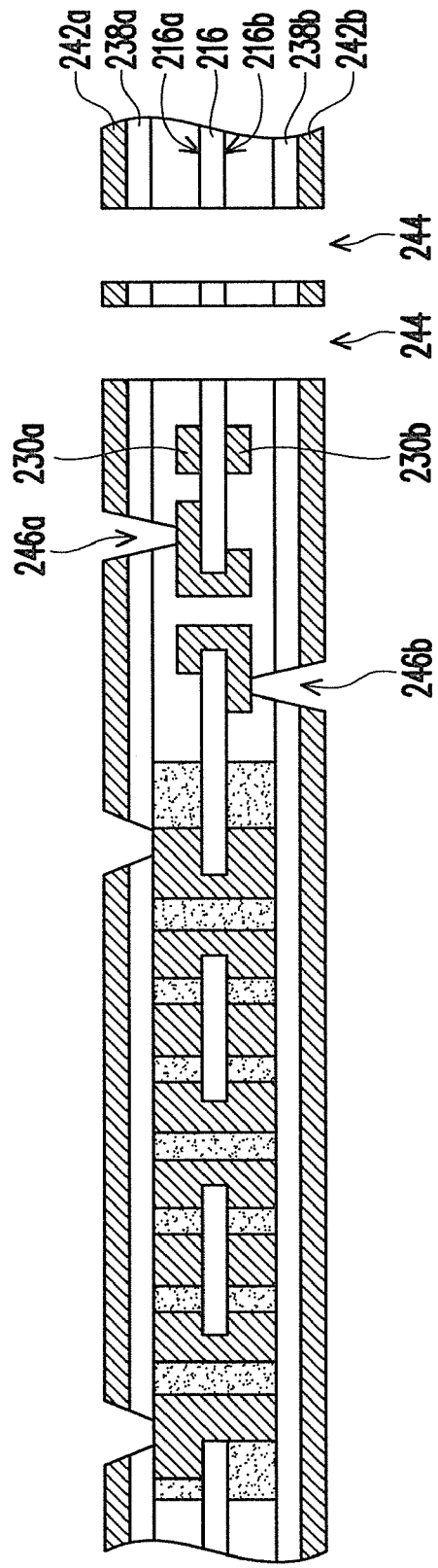
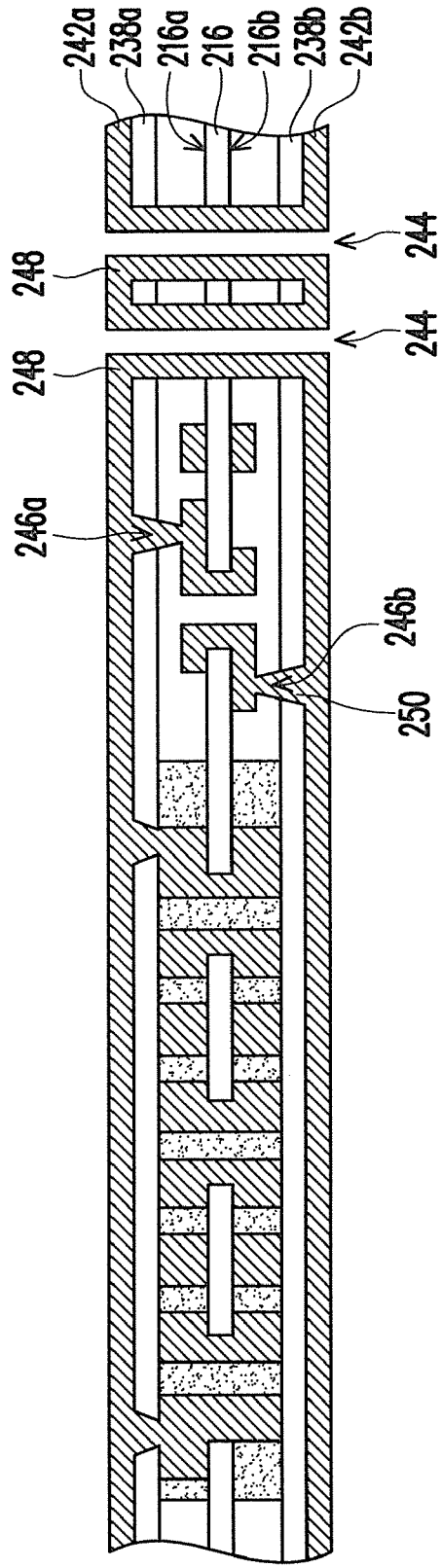
FIG. 2L
FIG. 2M

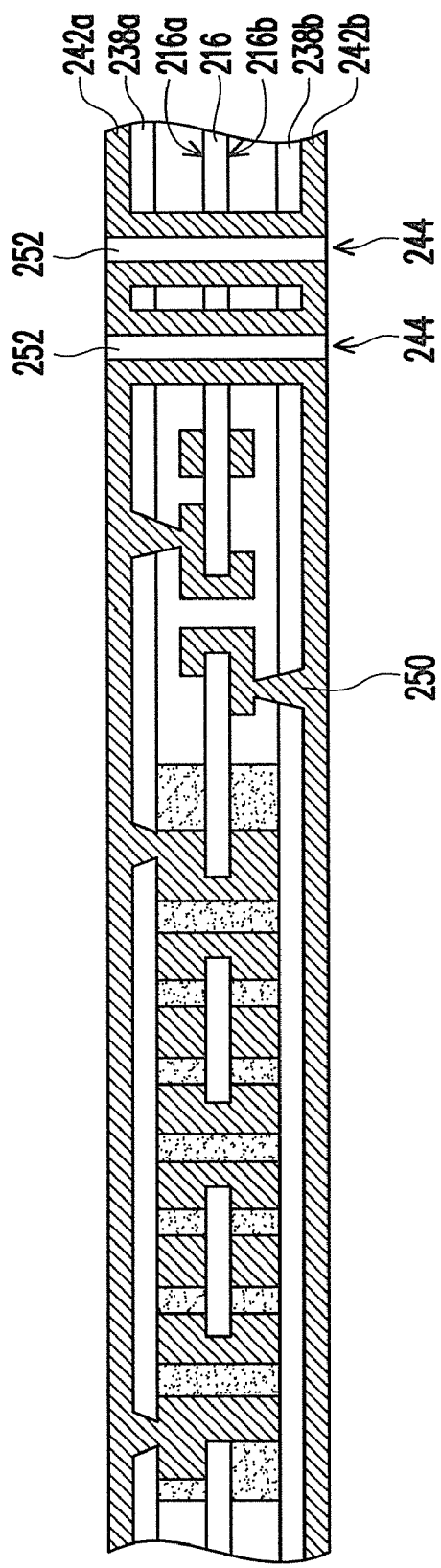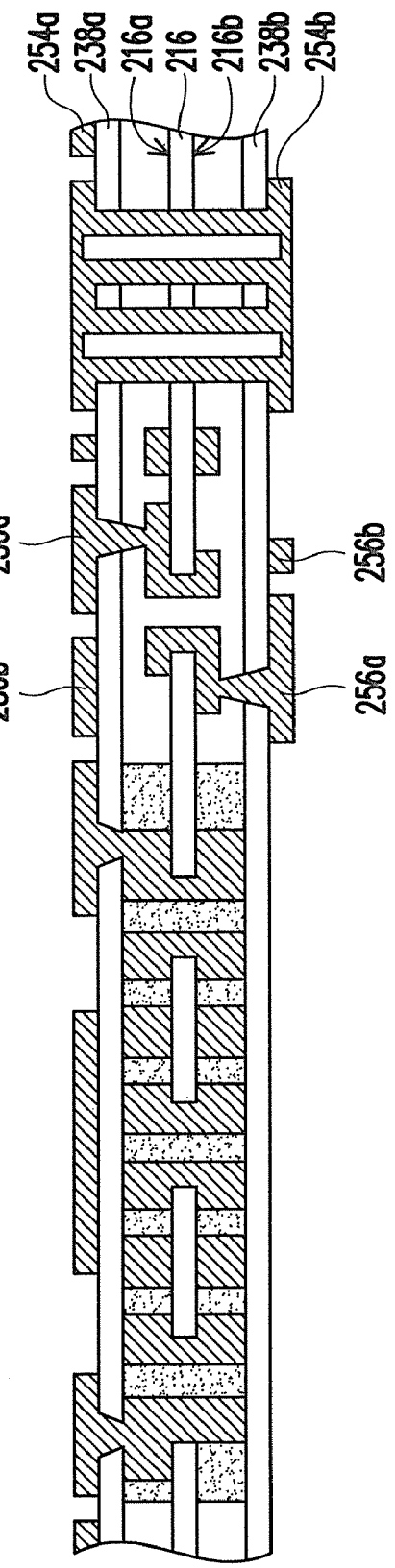
FIG. 2N
FIG. 2O

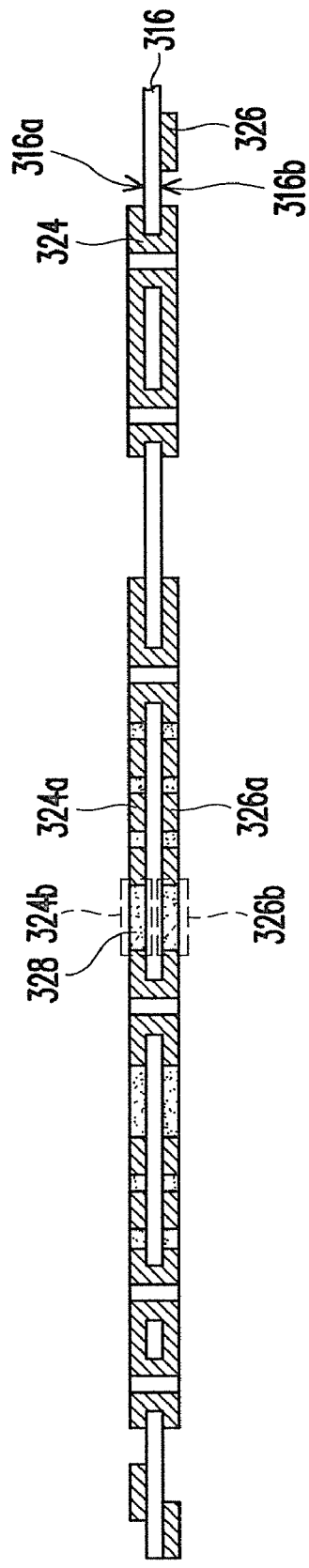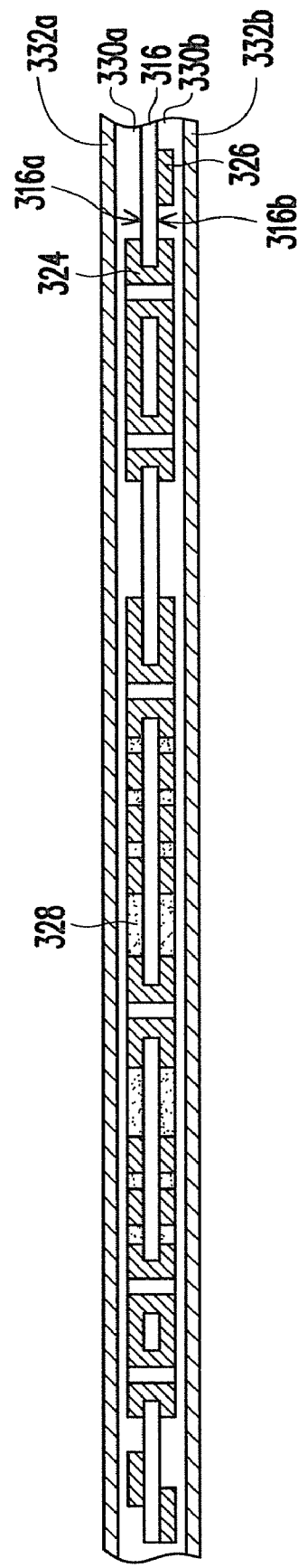

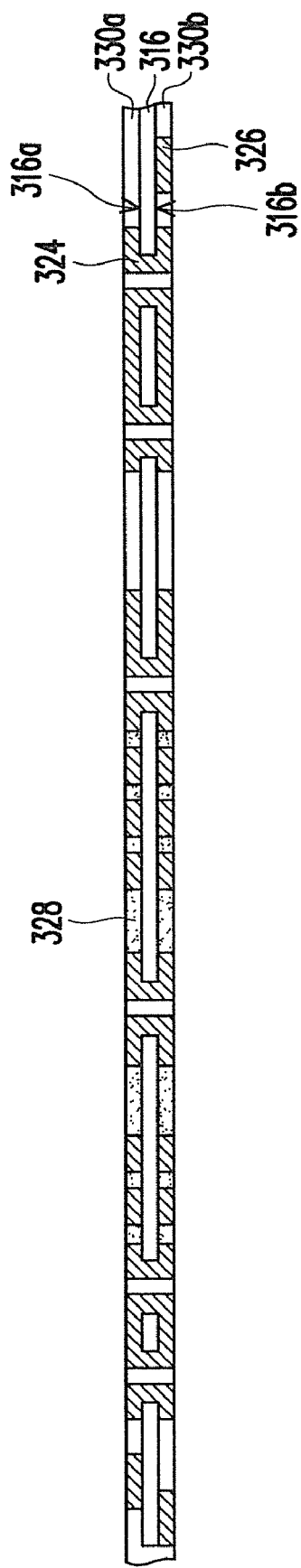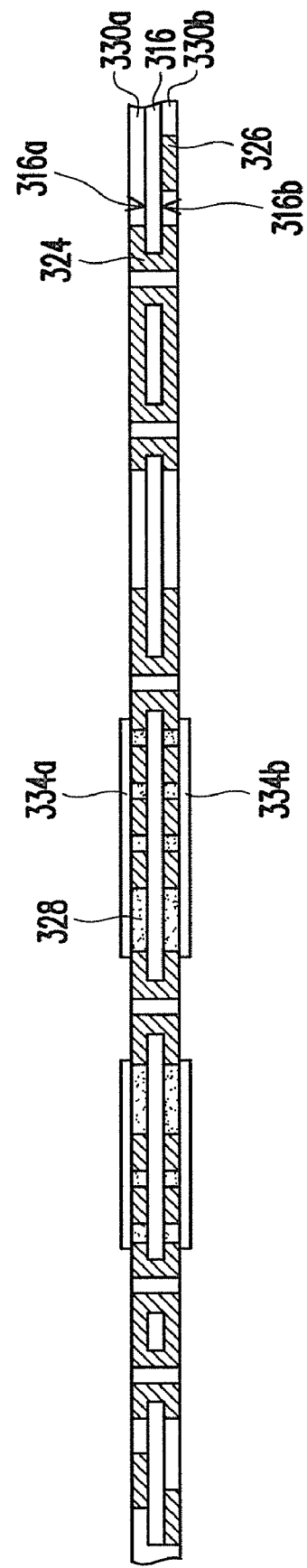
FIG. 3G
FIG. 3H

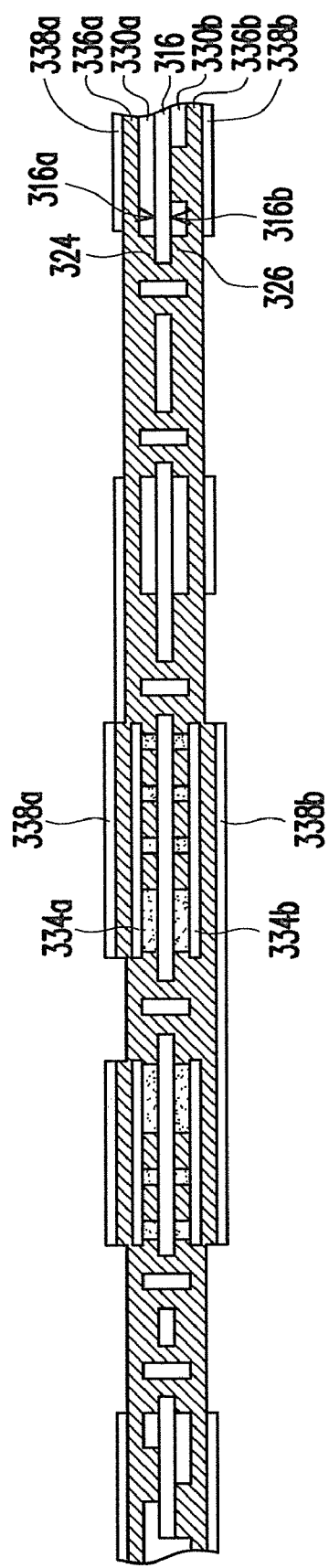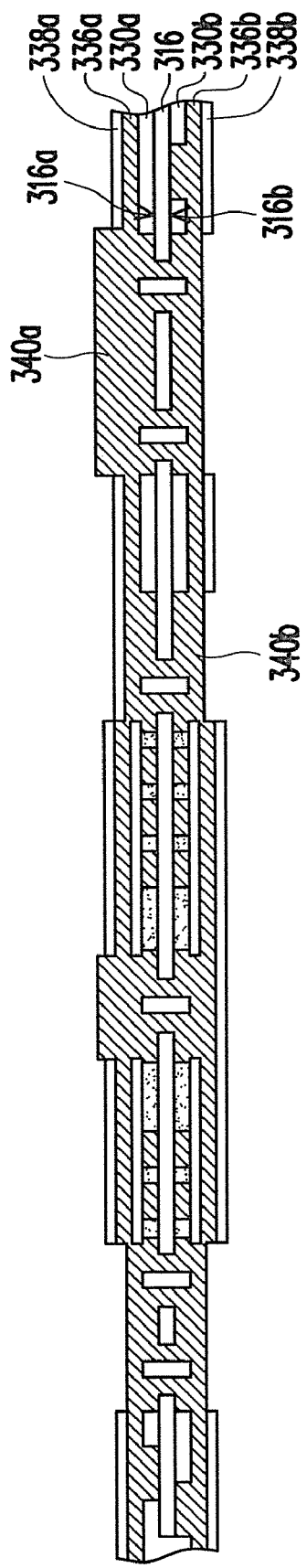
FIG. 3I
FIG. 3J

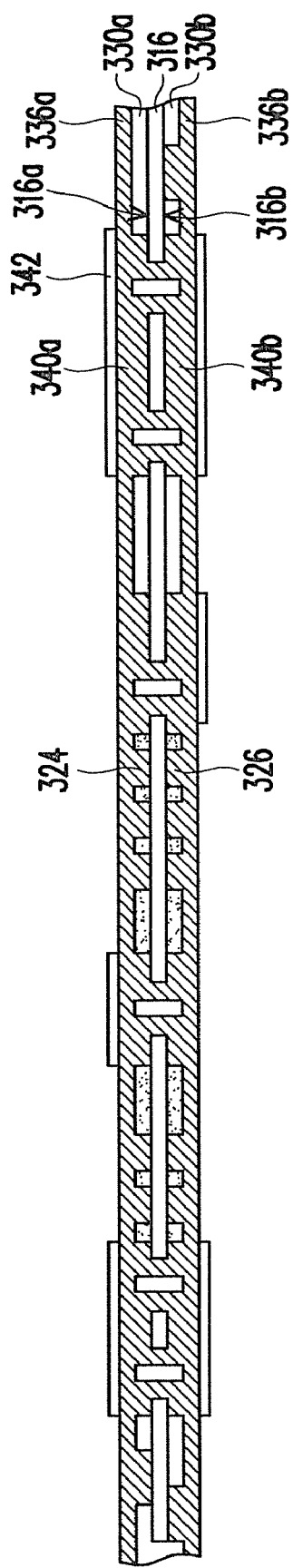
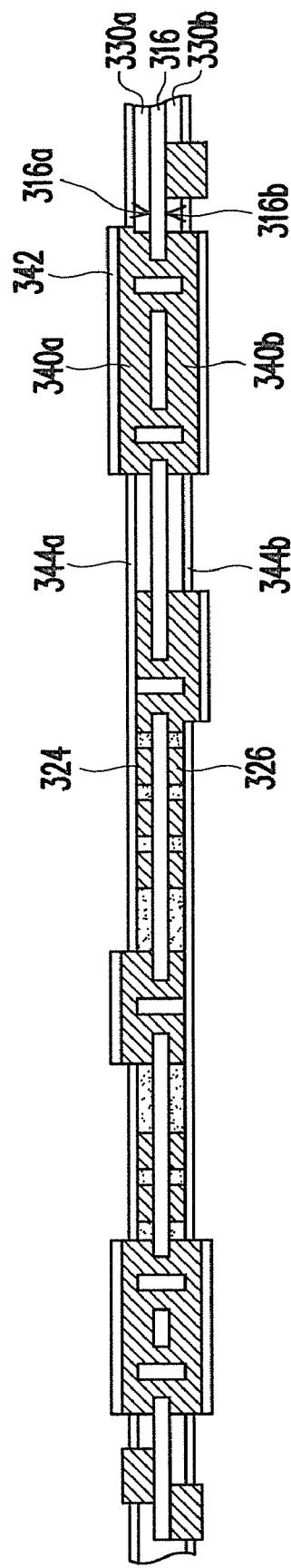
FIG. 3K
FIG. 3L

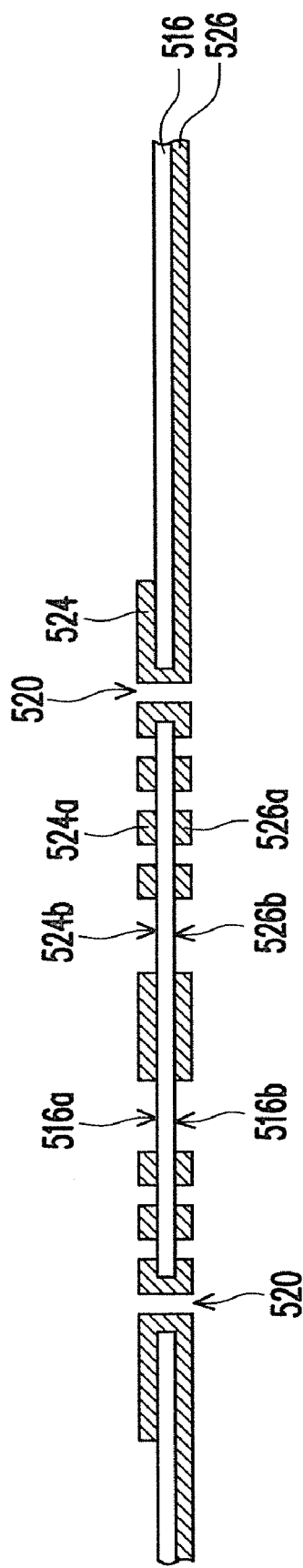
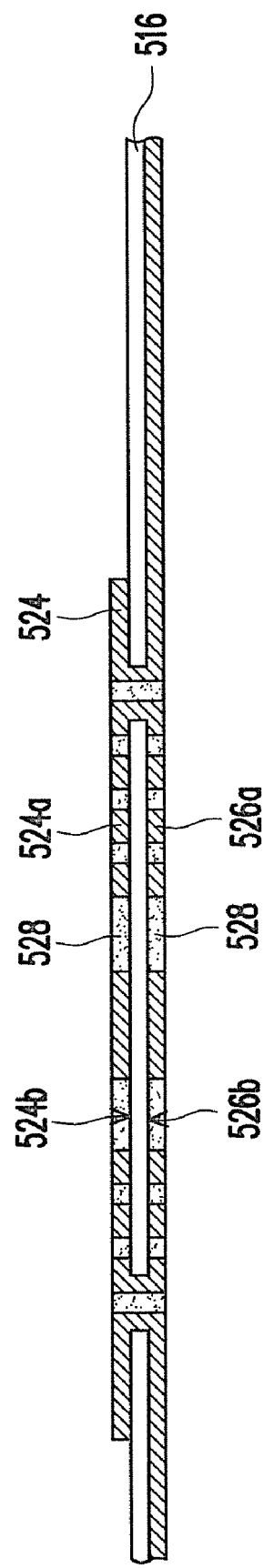
FIG. 4C
FIG. 4D

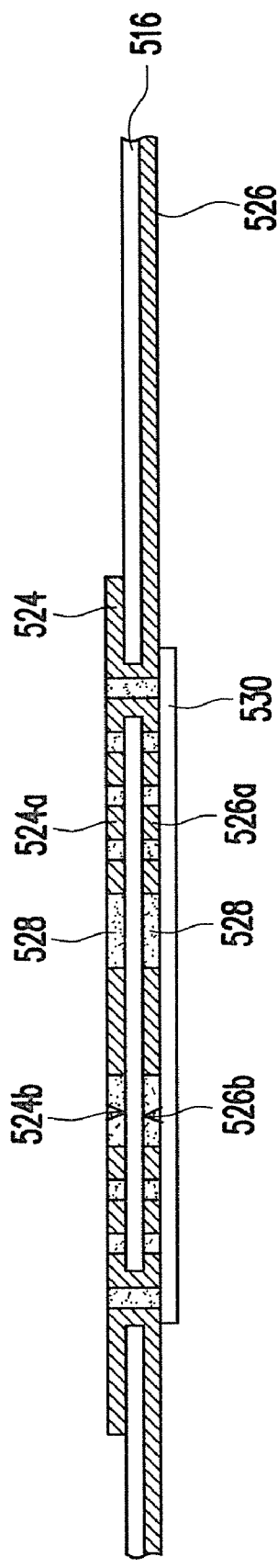
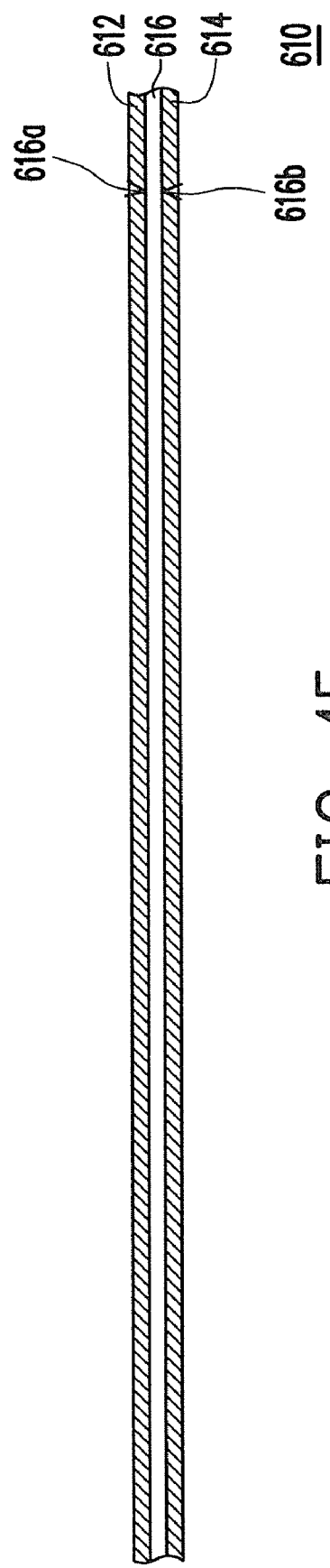
FIG. 4E
FIG. 4F

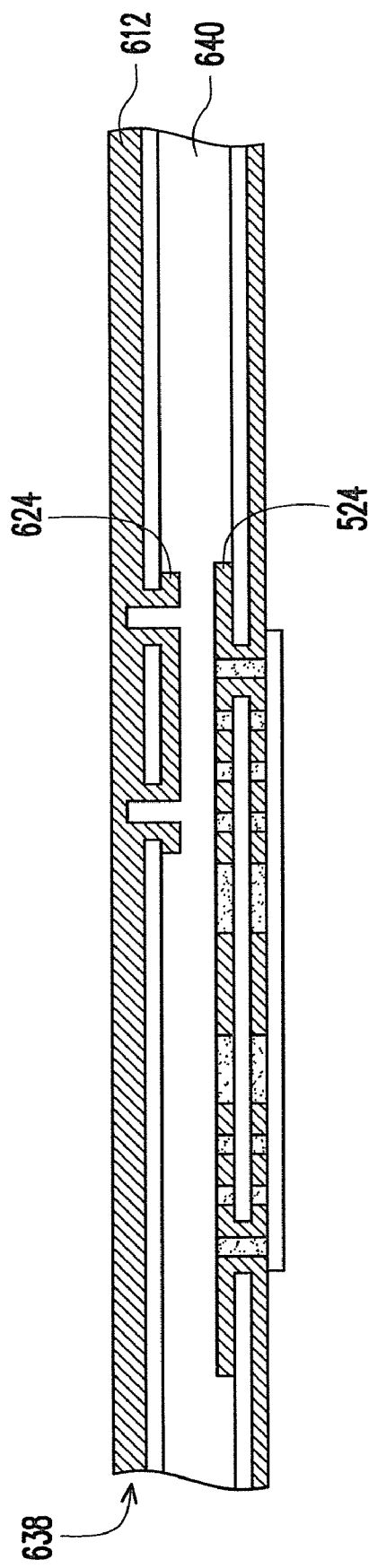
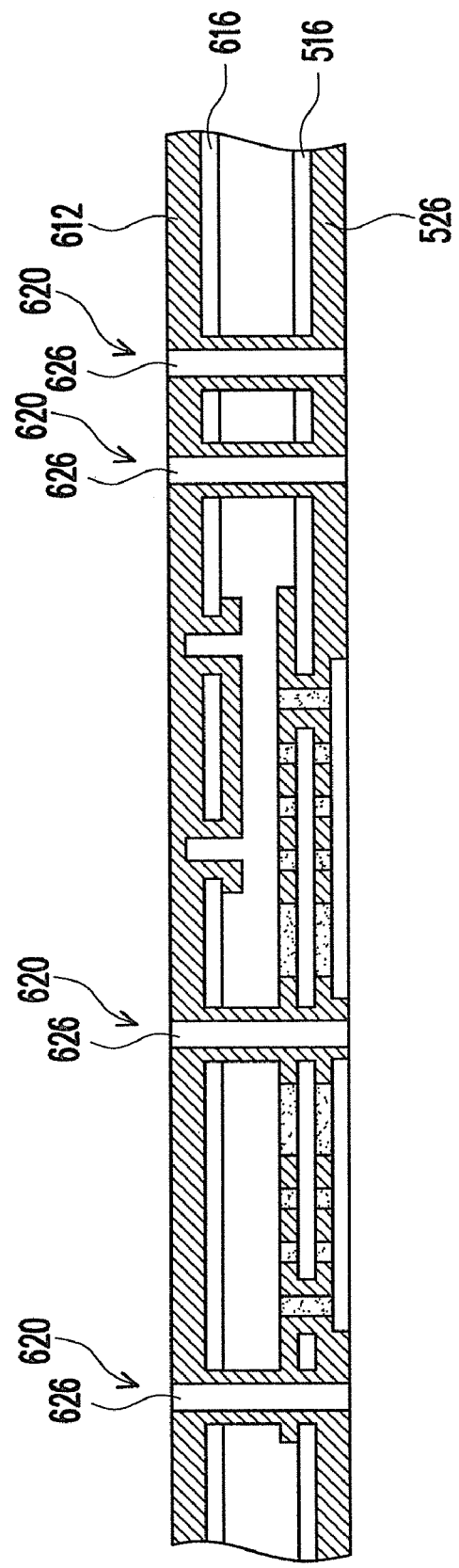
FIG. 4I
FIG. 4J

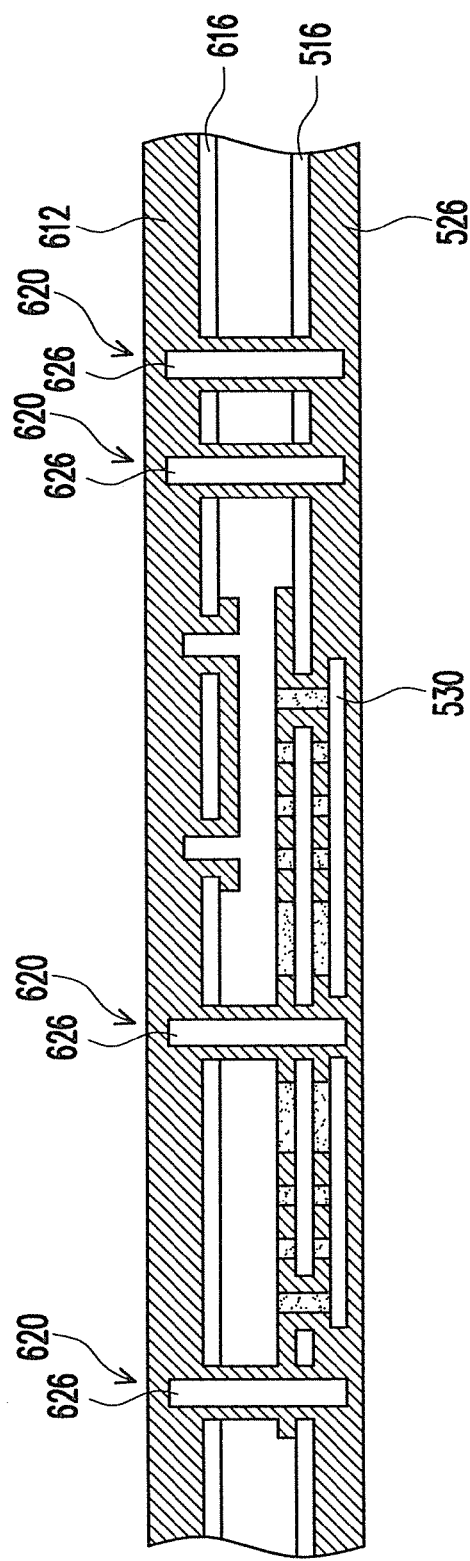
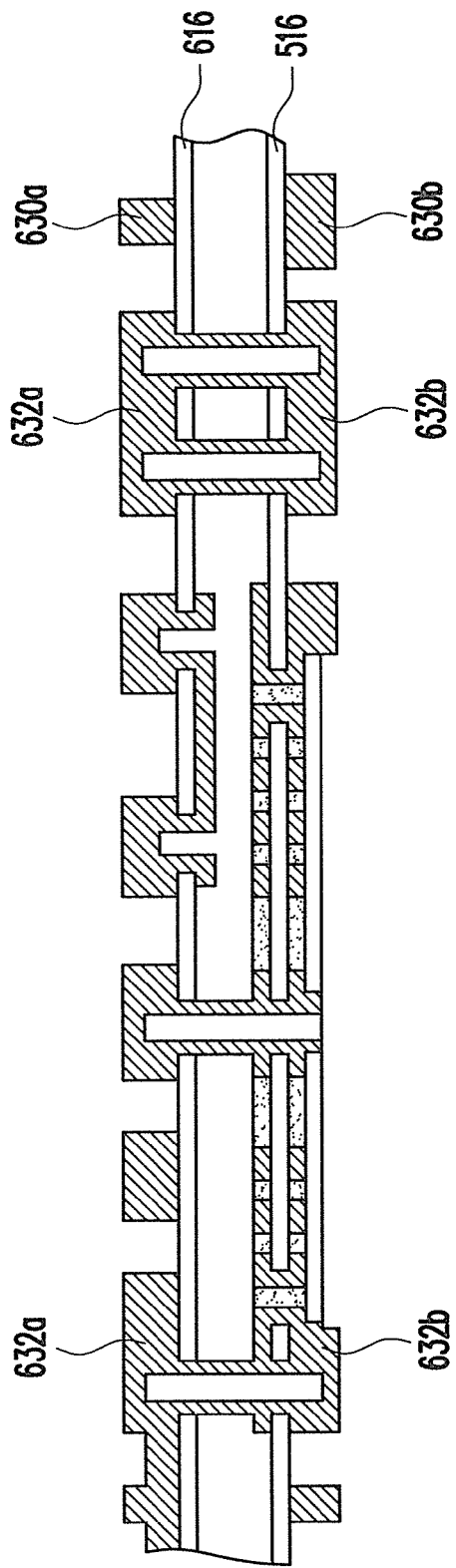
FIG. 4K
FIG. 4L

FABRICATING PROCESS FOR SUBSTRATE WITH EMBEDDED PASSIVE COMPONENT

CROSS-REFERENCE TO RELATED APPLICATION

This application claims the priority benefit of Taiwan application serial no. 97116997, filed on May 8, 2008. The entirety of the above-mentioned patent application is hereby incorporated by reference herein and made a part of this specification.

BACKGROUND OF THE INVENTION

1. Field of the Invention

The present invention relates to a fabricating process of a circuit board and particularly relates to a fabricating process of a substrate with an embedded passive component.

2. Description of Related Art

It is current trend to develop electronic products, such as computers, mobile phones, personal digital assistants (PDA), and flash memory devices, to have smaller sizes and more functions. Correspondingly, the wire density of the wiring board needs to be increased.

For the requirement of circuit design, the wiring board usually has a plurality of passive components, such as capacitances and inductances, disposed thereon. However, the passive components available in the market are usually standardized and have specific electric properties (inductance values and capacitance values, for example). It is to say that it is difficult to acquire passive components with various electric properties from the market. Hence, the passive components available in the market hardly meet the requirement of circuit design. In addition, the installation of the passive components occupies a certain area of the wiring board, which increases the layout and makes it difficult to miniaturize the wiring board. It does not conform to the current trend of developing smaller and lighter electronic devices.

SUMMARY OF THE INVENTION

The present invention is to provide a process for fabricating a substrate with an embedded passive component, so as to manufacture the embedded passive component in a wiring board.

In order to achieve the above or other purposes, the present invention provides a fabricating process of a substrate with an embedded passive component, comprising the following steps. First, a substrate comprising a top conductive layer, a bottom conductive layer, and at least an initial dielectric layer is provided. The initial dielectric layer has a top surface and a bottom surface opposite to the top surface, and the top conductive layer and the bottom conductive layer are respectively disposed on the top surface and the bottom surface. Next, a plurality of plating through holes (PTH) is formed in the substrate. After the plating through holes are formed, the top and the bottom conductive layers are patterned to respectively form a patterned top conductive layer and a patterned bottom conductive layer. The patterned top conductive layer comprises a plurality of first traces and the patterned bottom conductive layer comprises a plurality of second traces. A portion of the first traces forms a plurality of first trenches and a portion of the second traces forms a plurality of second trenches, wherein the first traces and the second traces respectively expose the top surface and the bottom surface in part. Thereafter, the first trenches and the second trenches are filled with a passive component material, wherein the first traces, the second traces, and the passive component material are adapted for forming a passive component.

The present invention uses the first traces, the second traces, and the passive component material filled in the first and the second trenches of the substrate to form the embedded passive component and thereby satisfy the requirement of circuit design.

To make the above and other objectives, features and advantages of the present invention more comprehensible, several embodiments accompanied by figures are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 4A to 4M illustrate a fabricating process of a substrate with an embedded passive component according to the fourth embodiment of the present invention.

DESCRIPTION OF EMBODIMENTS

First Embodiment

Figure 1A:
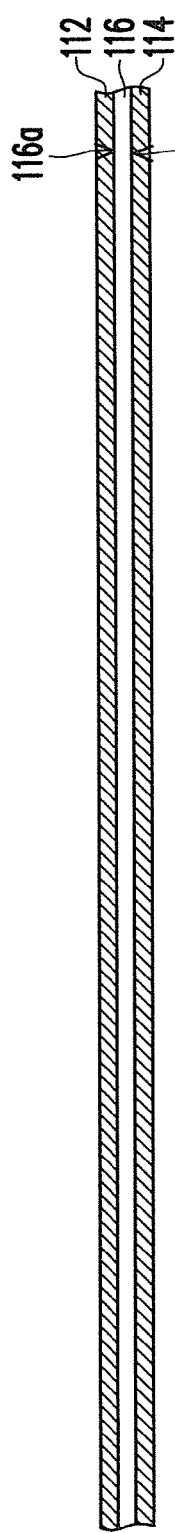
FIGS. 1A to 1O illustrate a fabricating process of a substrate with an embedded passive component according to the first embodiment of the present invention.

FIGS. 1A to 1O illustrate a fabricating process of a substrate with an embedded passive component according to the first embodiment of the present invention. Referring to FIG. 1A, a substrate 110 is provided first. The substrate 110 comprises a top conductive layer 112, a bottom conductive layer 114, and at least an initial dielectric layer 116. The initial dielectric layer 116 comprises a top surface 116a and a bottom surface 116b opposite to the top surface 116a. The initial dielectric layer 116 is formed by using an insulating material, and the initial dielectric layer 116 may be formed by a prepreg comprising resin and glass fiber. The top conductive layer 112 and the bottom conductive layer 114 are separately disposed on the top surface 116a and the bottom surface 116b. The top conductive layer 112 and the bottom conductive layer 114 may be formed by copper, aluminum, aluminum-copper alloy, or other suitable conductive materials.

Figure 1B:
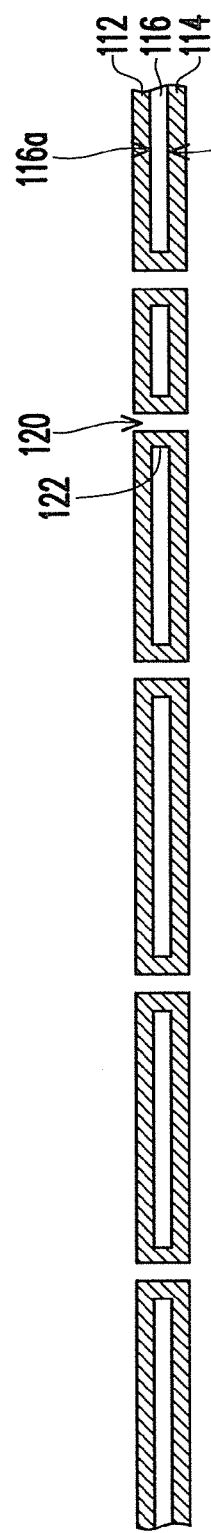

Next, referring to FIG. 1B, a plurality of plating through holes 120 is formed in the substrate 110 (referring to FIG. 1A). An inner wall of each plating through hole 120 is a conductive wall 122 electrically connected to the top conductive layer 112 and the bottom conductive layer 114. Hence, the top conductive layer 112 is electrically connected with the bottom conductive layer 114 by the plating through holes 120. The plating through holes 120 may be formed by drilling, chemical copper plating, or electroplating.

Figure 1C:
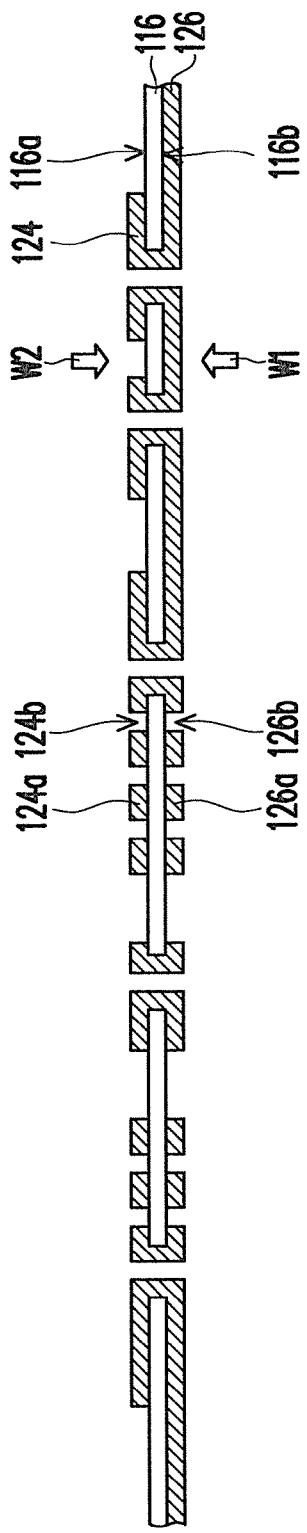

Referring to FIG. 1C, after the plating through holes 120 are formed, the top conductive layer 112 and the bottom conductive layer 114 (referring to FIG. 1B) are patterned to respectively form a patterned top conductive layer 124 and a patterned bottom conductive layer 126. The top conductive layer 112 and the bottom conductive layer 114 may be patterned by performing photolithography and etching.

The patterned top conductive layer 124 comprises a plurality of first traces 124a and the patterned bottom conductive layer 126 comprises a plurality of second traces 126a. The first traces 124a partially expose the top surface 116a of the initial dielectric layer 116 and the second traces 126a partially expose the bottom surface 116b of the initial dielectric layer 116, wherein a portion of the first traces 124a forms a plurality of first trenches 124b and a portion of the second traces 126a forms a plurality of second trenches 126b. From the upward direction W1 and the downward direction W2, a shape of the first traces 124a and the second traces 126a may be spiral.

Figure 1D:
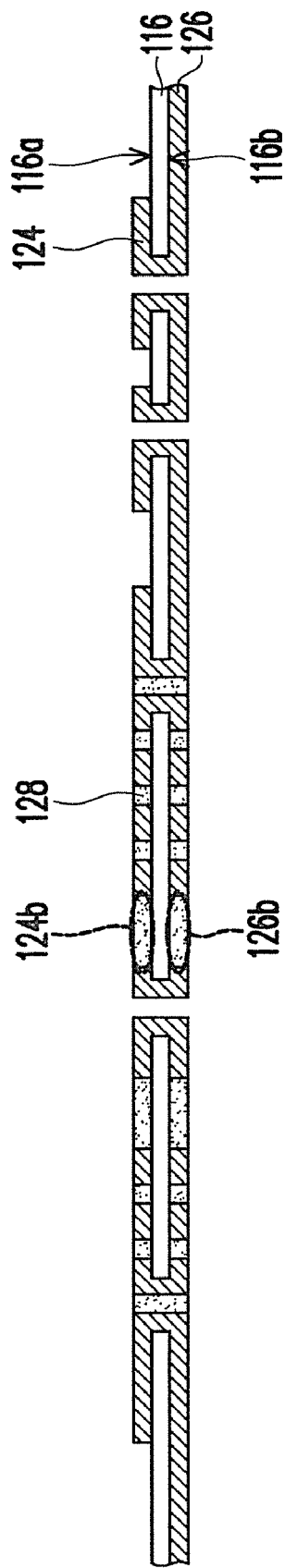

Then, referring to FIG. 1D, a passive component material 128 is filled into the first trenches 124b and the second trenches 126b. The first traces 124a, the second traces 126a, and the passive component material 128 together form a passive component which may be a resistance or inductance component. The passive component material 128 may be paste-like. Hence, the passive component material 128 may be filled into the first trenches 124b and the second trenches 126b by printing. Because the passive component may be an inductance or a resistance component, different materials may serve as the passive component material 128 according to the type of the passive component. The passive component material 128 may comprise a ferromagnetic material or a ferrimagnetic material, so that the first traces 124a and the second traces 126a may form the inductance component. Otherwise, the passive component material 128 may comprise an insulating material or a dielectric material, so that the first traces 124a and the second traces 126a may form the resistance component.

Moreover, it is noted that the patterned top conductive layer 124 and the patterned bottom conductive layer 126 may be roughened, such as black oxide or brown oxide, before the passive component material 128 is filled. Consequently, when at least a dielectric layer is added onto the patterned top conductive layer 124 or the patterned bottom conductive layer 126, the dielectric layer would be steadily attached to the patterned top conductive layer 124 or the patterned bottom conductive layer 126 to prevent peeling.

Figure 1E:
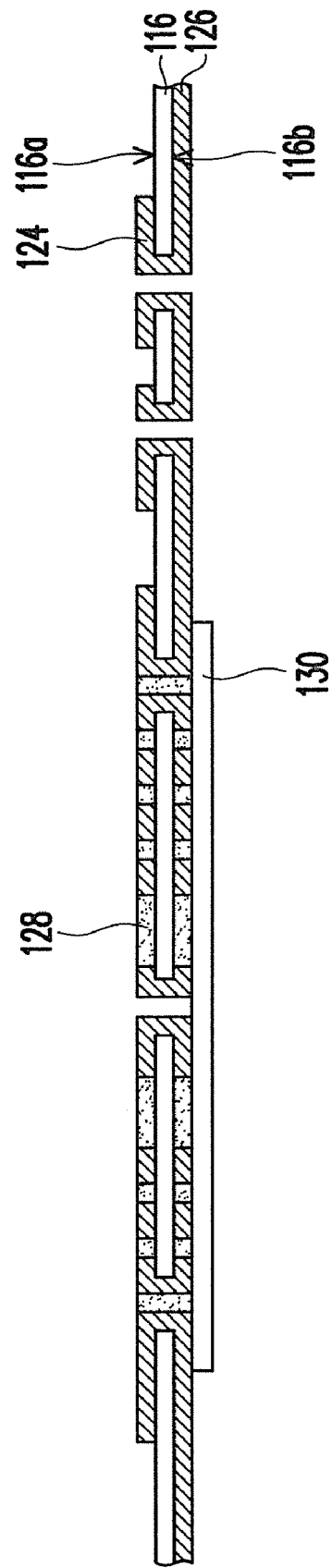

Referring to FIG. 1E, after the passive component material 128 is filled into the first trenches 124b and the second trenches 126b, a sealing layer 130 may be further formed on a portion of the patterned bottom conductive layer 126 to seal the passive component material 128 inside the patterned bottom conductive layer 126. The sealing layer 130 may be formed by a thermosetting resin or other suitable resins.

Referring to FIG. 1F, after the sealing layer 130 is formed, a first dielectric layer 132 may be formed and a first conductive layer 134 may be formed on the first dielectric layer 132. The first dielectric layer 132 covers the top surface 116a of the initial dielectric layer 116 and the patterned top conductive layer 124, and the first dielectric layer 132 and the first conductive layer 134 may be simultaneously formed. In this embodiment, the first dielectric layer 132 and the first conductive layer 134 may be a resin coated copper. Therefore, the first conductive layer 134 and the first dielectric layer 132 may be formed by compressing the resin coated copper onto the patterned top conductive layer 124. A method for compressing the resin coated copper may be a hot pressing process.

Referring to FIG. 1G, a plurality of first blind holes 136 is formed thereafter, wherein the first blind holes 136 extend from the first conductive layer 134 to the patterned top conductive layer 124, and the first blind holes 136 may be formed by using laser ablation. After the first blind holes 136 are formed by laser ablation, scum is formed in the first blind holes 136 and covers the patterned top conductive layer 124. After the first blind holes 136 are formed, a cleaning process (such as desmear) may be performed on the surface of the patterned top conductive layer 124 to remove the scum covering thereon, so that the first blind holes 136 may expose the surface of the patterned top conductive layer 124.

Then, referring to FIGS. 1H and 1I, a plurality of first conductive pillars 140 is formed in the first blind holes 136, so as to electrically connect the first conductive layer 134 with the patterned top conductive layer 124. The conductive pillars 140 may be formed by various methods. In this embodiment, a method for forming the first conductive pillars 140 comprises the following steps. First, referring to FIG. 1H, a first seed layer 138 is formed on an inner wall of each first blind hole 136. The first seed layer 138 electrically connects the patterned top conductive layer 124 with the first conductive layer 134, and the first seed layer 138 may be formed by electroless plating.

Referring to FIG. 1I, electroplating is then performed on the first seed layers 138 to form the first conductive pillars 140 in the first blind holes 136. When the first conductive pillars 140 are formed, the thickness of the patterned bottom conductive layer 126 increases and the patterned bottom conductive layer 126 covers the sealing layer 130.

In an embodiment not disclosed by the figures, the first dielectric layer 132 may comprise a photo-resist material. In other words, the first dielectric layer 132 may be a dry film or a photosensitive resin. After the first dielectric layer 132 is formed on the top surface 116a of the initial dielectric layer 116 and the patterned top conductive layer 124, exposure and development processes may be performed on the first dielectric layer 132. Thereafter, the first conductive layer 134 and the first conductive pillars 140 are formed by using electroplating. Hence, the method for forming the first dielectric layer 132, the first conductive layer 134, and the first conductive pillars 140 as disclosed by FIGS. 1F to 1I is merely one of the examples. The present invention is not limited thereto.

Figure 1J:
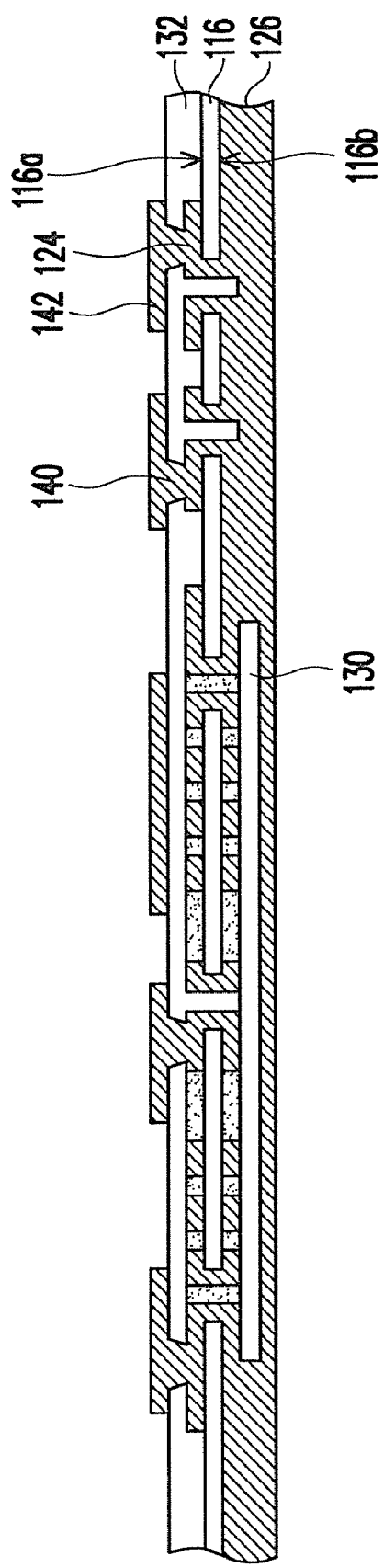

Referring to FIG. 1J, the first conductive layer 134 is patterned to form a first patterned conductive layer 142, and the first patterned conductive layer 142 partially exposes the first dielectric layer 132. Additionally, the first conductive layer 134 may be patterned by photolithography and etching.

Figure 1K:
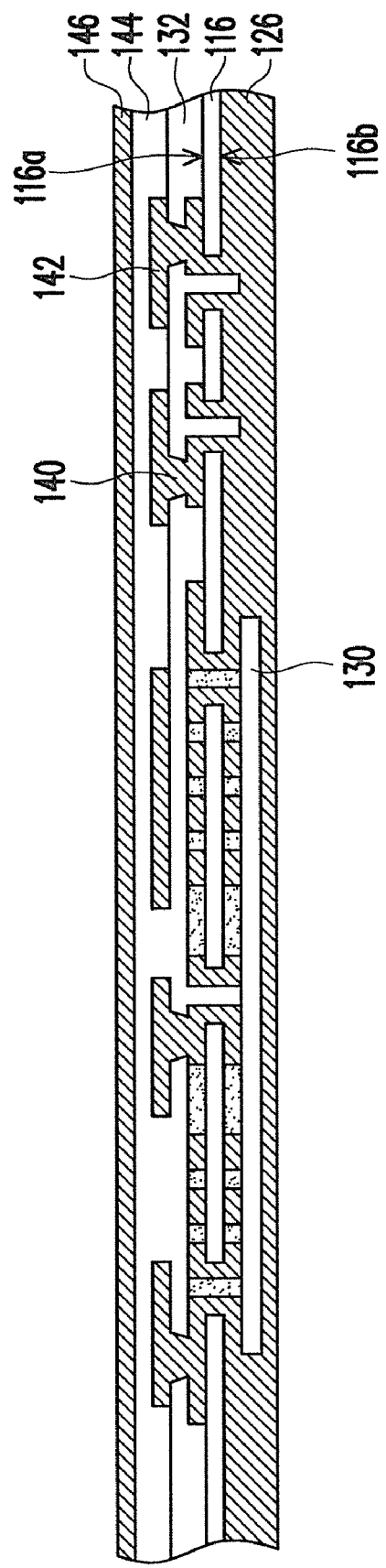

Referring to FIG. 1K, the following steps are performed after the first patterned conductive layer 142 is formed. A second dielectric layer 144 is formed to cover the first dielectric layer 132 and the first patterned conductive layer 142. A second conducive layer 146 is formed on the second dielectric layer 144. Before the second dielectric layer 144 is formed, the first patterned conductive layer 142 may be roughened, such as black oxide or brown oxide. Thereby, the second dielectric layer 144 is steadily attached to the first patterned conductive layer 142.

In addition, the second conductive layer 146 and the second dielectric layer 144 may be formed simultaneously. For instance, the second conductive layer 146 and the second dielectric layer 144 may also be a resin coated copper. Therefore, the second conductive layer 146 and the second dielectric layer 144 may be formed by compressing the resin coated copper onto the first patterned conductive layer 142.

Figure 1L:
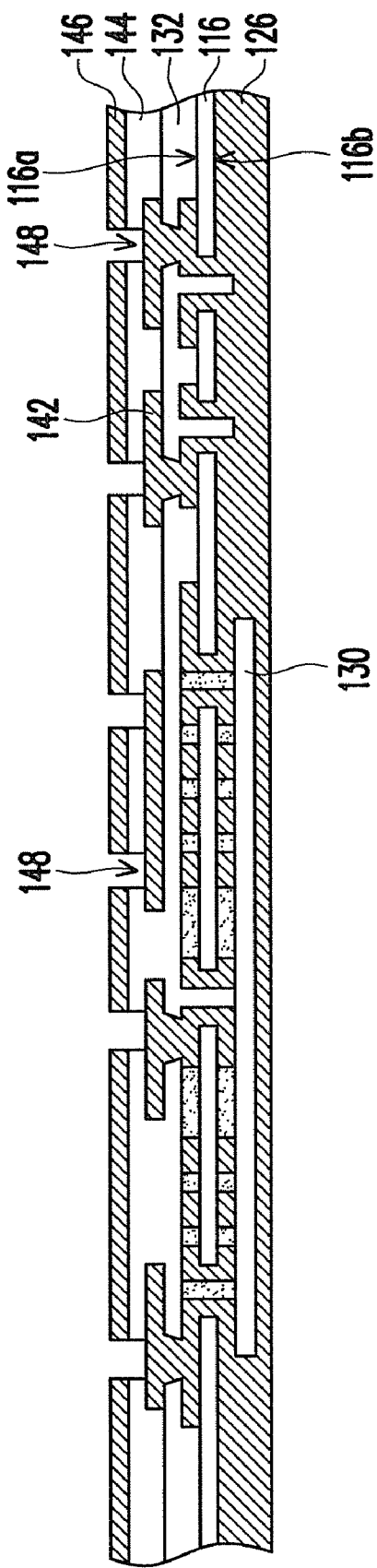
Figure 1M:
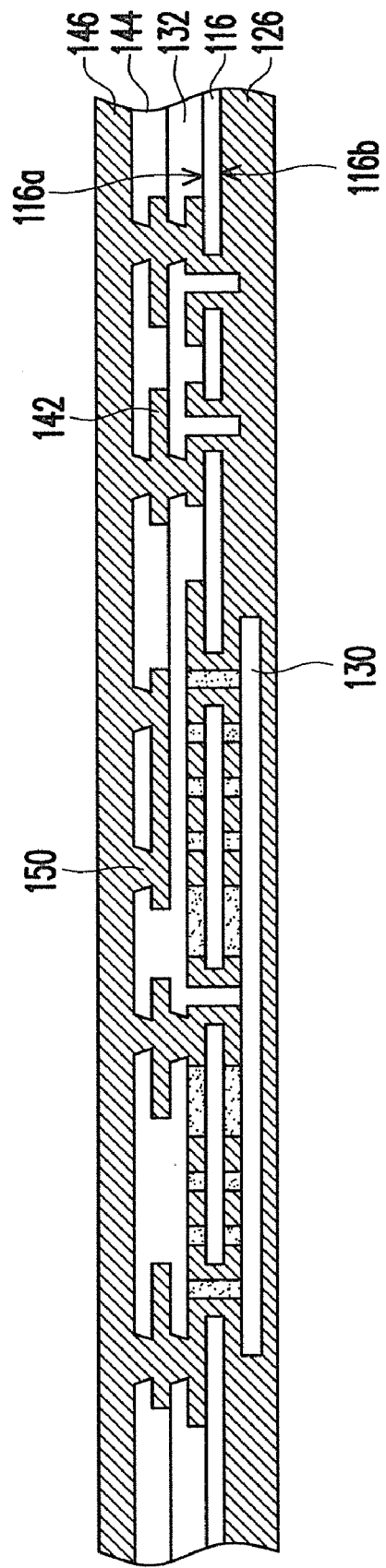

Referring to FIG. 1L, a plurality of second blind holes 148 is formed. The second blind holes 148 extend from the second conductive layer 146 to the first patterned conductive layer 142, and the second blind holes 148 are formed by laser ablation. Moreover, a desmear process may be performed on the second blind holes 148 after the second blind holes 148 are formed. Referring to FIG. 1M, a plurality of second conductive pillars 150 is formed in the second blind holes 148.

In this embodiment, a method for forming the second conductive pillars 150 may be the same as the method for forming the first conductive pillars 140 as disclosed by FIGS. 1H and 1I. It is to say that a second seed layer (not shown) may be formed on an inner wall of each second blind hole 148 to connect the second conductive layer 146 and the first patterned conductive layer 142. Then, the second seed layers are electroplated to form the second conductive pillars 150. Because a method for forming the second conductive pillars 150 is the same as the method for forming the first conductive pillars 140, the descriptions thereof are omitted herein. Moreover, it is noted that the method for forming the second dielectric layer 144, the second conductive layer 146, and the second conductive pillars 150 as disclosed by FIGS. 1K to 1M is merely one of the examples. The present invention is not limited thereto.

Referring to FIG. 1N, the second conductive layer 146 and the patterned bottom conductive layer 126 (referring to FIG. 1M) are patterned to respectively form a second patterned conductive layer 154 and a twice-patterned bottom conductive layer 152 after the second conductive pillars 150 are formed. The second patterned conductive layer 154 exposes the second dielectric layer 144 partially, and the twice-patterned bottom conductive layer 152 exposes the sealing layer 130 and a portion of the initial dielectric layer 116. The second patterned conductive layer 154 and the twice-patterned bottom conductive layer 152 may comprise a plurality of bonding pads 156 and a plurality of traces (not shown). In an embodiment not disclosed by the figures, an anti-oxidation layer (for example, a Ni/Au layer) may be formed on each bonding pad 156 to protect the bonding pads 156 from being oxidized.

Next, referring to FIG. 1O, a patterned top solder mask 158a is formed on the initial dielectric layer 116, the second dielectric layer 144, and the second patterned conductive layer 154. Further, a patterned bottom solder mask 158b is formed on the second patterned bottom conductive layer 152 and the sealing layer 130. Additionally, the patterned top solder mask 158a and the patterned bottom solder mask 158b both expose the bonding pads 156. After the patterned top solder mask 158a and the patterned bottom solder mask 158b are formed, the substrate with the embedded passive component is substantially completed.

Second Embodiment

Figure 2A:
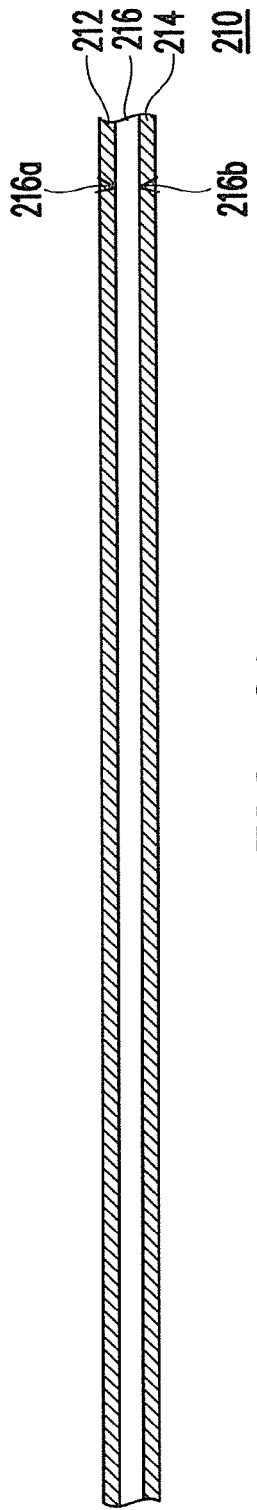
FIGS. 2A to 2O illustrate a fabricating process of a substrate with an embedded passive component according to the second embodiment of the present invention.

FIGS. 2A to 2O illustrate a fabricating process of a substrate with an embedded passive component according to the second embodiment of the present invention. Referring to FIG. 2A, a substrate 210 is provided first. The substrate 210 comprises a top conductive layer 212, a bottom conductive layer 214, and at least an initial dielectric layer 216 having a top surface 216a and a bottom surface 216b opposite to the top surface 216a.

Figure 2B:
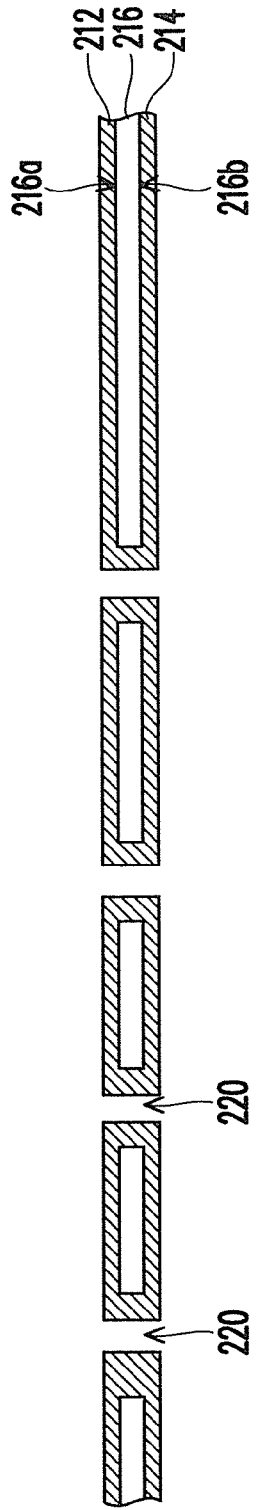

Then, referring to FIG. 2B, a plurality of plating through holes 220 is formed on the substrate 210 (referring to FIG. 2A) to electrically connect the top conductive layer 212 and the bottom conductive layer 214. Because the structure and fabricating method of the plating through holes 220 are the same as those of the plating through holes 120 in the first embodiment (referring to FIG. 1B), the descriptions thereof are omitted herein.

Figure 2C:
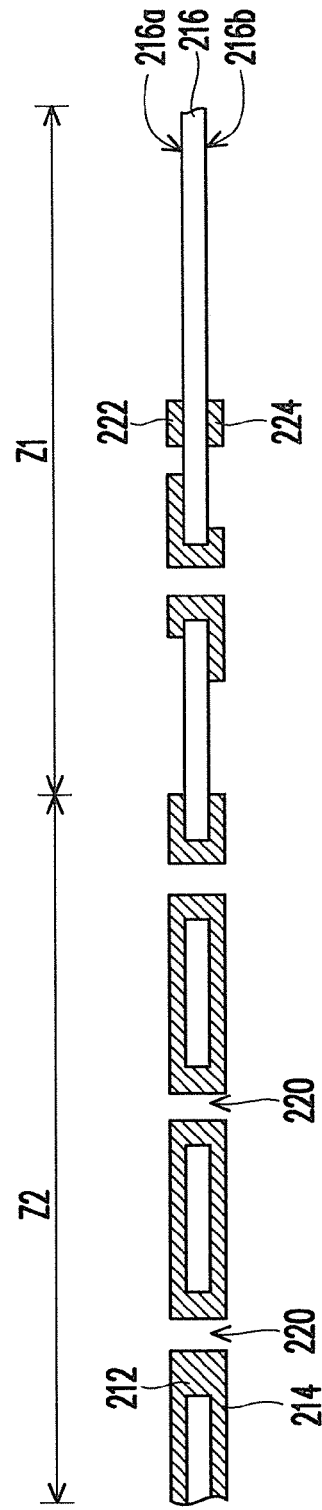

Referring to FIG. 2C, the substrate is divided into a first zone Z1 and a second zone Z2. After the plating through holes 220 are formed, the top conductive layer 212 and the bottom conductive layer 214 as shown in FIG. 2B are patterned to form a first patterned top conductive layer 222 and a first patterned bottom conductive layer 224 in the first zone Z1. The first patterned top conductive layer 222 and the first patterned bottom conductive layer 224 respectively partially expose the top surface 216a and the bottom surface 216b of the initial dielectric layer 216. The top conductive layer 212 and the bottom conductive layer 214 may be patterned by photolithography and etching.

Next, referring to FIG. 2D, a top electroplating seed layer 226a and a bottom electroplating seed layer 226b are simultaneously formed. The top electroplating seed layer 226a covers the first patterned top conductive layer 222 and the top surface 216a exposed by the first patterned top conductive layer 222, and the bottom electroplating seed layer 226b covers the first patterned bottom conductive layer 224 and the bottom surface 216b exposed by the first patterned bottom conductive layer 224. The top electroplating seed layer 226a and the bottom electroplating seed layer 226b may be formed by electroless plating. Therefore, the top electroplating seed layer 226a and the bottom electroplating seed layer 226b may also be formed on the first patterned top conductive layer 222, the first patterned bottom conductive layer 224, the top conductive layer 212, and the bottom conductive layer 214 (in the second zone Z2).

However, the top electroplating seed layer 226a and the bottom electroplating seed layer 226b formed on these conductive layers have very thin thicknesses, which does not influence the overall efficiency of the process for fabricating the substrate with the embedded passive component in the present invention. For this reason, FIG. 2D does not illustrate that the top electroplating seed layer 226a and the bottom electroplating seed layer 226b are on the first patterned top conductive layer 222, the first patterned bottom conductive layer 224, the top conductive layer 212, and the bottom conductive layer 214.

Referring to FIG. 2E, a top anti-plating layer 228a and a bottom anti-plating layer 228b are formed thereafter. The top anti-plating layer 228a covers the first patterned top conductive layer 222 and the top electroplating seed layer 226a, and the bottom anti-plating layer 228b covers the first patterned bottom conductive layer 224 and the bottom electroplating seed layer 226b. The thickness of the top anti-plating layer 228a is larger than the thickness of the top conductive layer 212, and the thickness of the bottom anti-plating layer 228b is larger than the thickness of the bottom conductive layer 214. Moreover, a material of the top anti-plating layer 228a and the bottom anti-plating layer 228b may be a dry film. The top anti-plating layer 228a and the bottom anti-plating layer 228b may be formed by compressing the dry film.

Referring to FIG. 2F, after the top anti-plating layer 228a and the bottom anti-plating layer 228b are formed, the thicknesses of the top conductive layer 212 and the bottom conductive layer 214 in the second zone Z2 are increased by electroplating.

Referring to FIG. 2G, after the thicknesses of the top conductive layer 212 and the bottom conductive layer 214 in the second zone Z2 are increased, the top anti-plating layer 228a and the bottom anti-plating layer 228b are removed. After the top anti-plating layer 228a and the bottom anti-plating layer 228b are removed, a portion of the top electroplating seed layer 226a and the bottom electroplating seed layer 226b are removed to partially expose the initial dielectric layer 216. In this embodiment, a method for removing the portion of the top electroplating seed layer 226a and the bottom electroplating seed layer 226b is to perform micro-etching on the top electroplating seed layer 226a and the bottom electroplating seed layer 226b.

Figure 2H:
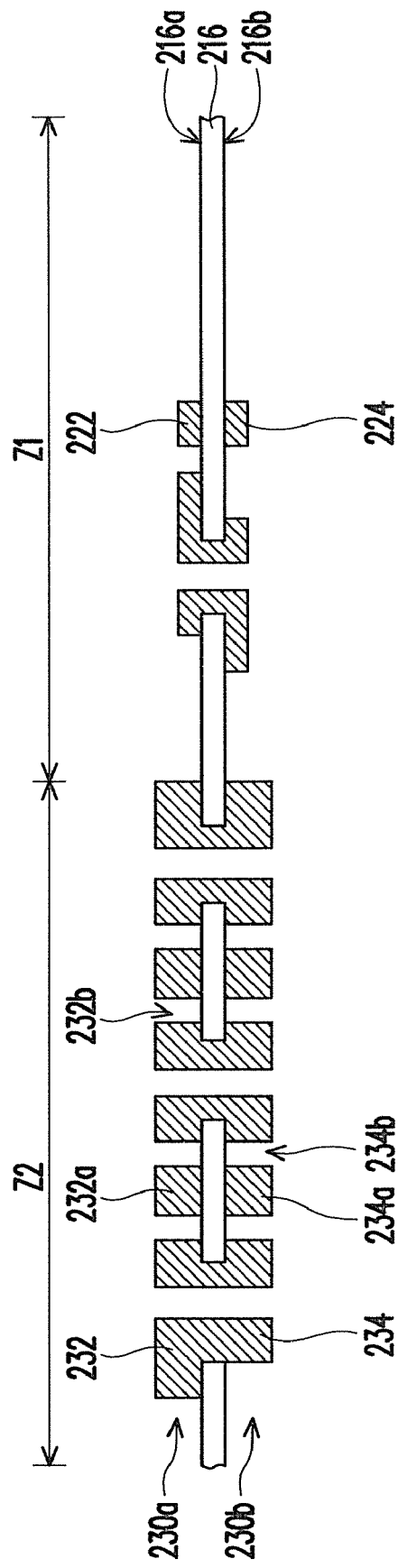

Referring to FIG. 2H, after the thicknesses of the top conductive layer 212 and the bottom conductive layer 214 are increased, the top conductive layer 212 and the bottom conductive layer 214 in the second zone Z2 shown in FIG. 2G are patterned to respectively form a second patterned top conductive layer 232 and a second patterned bottom conductive layer 234. Therefore, the first patterned top conductive layer 222 and the first patterned bottom conductive layer 224 are in the first zone Z1, and the second patterned top conductive layer 232 and the second patterned bottom conductive layer 234 are in the second zone Z2.

Additionally, the second patterned top conductive layer 232 comprises a plurality of first traces 232a and the second patterned bottom conductive layer 234 comprises a plurality of second traces 234a. The first traces 232a and the second traces 234a respectively form a plurality of first trenches 232b and a plurality of second trenches 234b, and partially expose the top surface 216a and the bottom surface 216b of the initial dielectric layer 216. Consequently, a patterned top conductive layer 230a, comprising the first patterned top conductive layer 222 and the second patterned top conductive layer 232, and a patterned bottom conductive layer 230b, comprising the first patterned bottom conductive layer 224 and the second patterned bottom conductive layer 234, are formed.

Figure 2I:
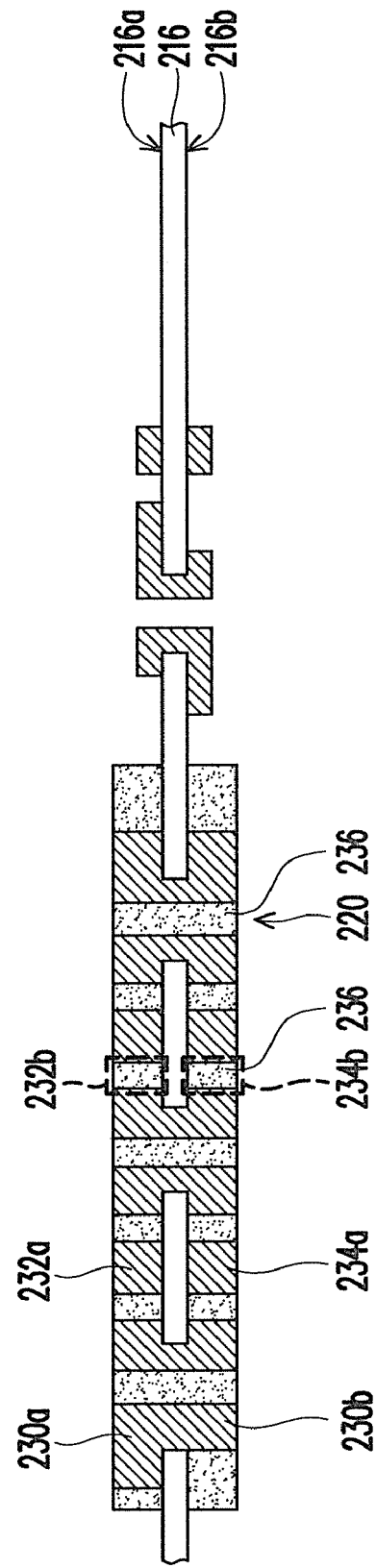

Referring to FIG. 2I, a passive component material 236 is then filled into the first trenches 232b, the second trenches 234b, and a portion of the plating through holes 220. The first traces 232a, the second traces 234a, and the passive component material 236 together form a passive component. According to the requirement of the products, the passive component material 236 may comprise a ferromagnetic material or a ferrimagnetic material, so as to form an inductance component. Certainly, the passive component material 236 may comprise an insulating material or a dielectric material to form a resistance component. Moreover, the passive component material 236 may be paste-like. Hence, the passive component material 236 may be printed into the first trenches 232b and the second trenches 234b.

Furthermore, before the passive component material 236 is filled, the patterned top conductive layer 230a and the patterned bottom conductive layer 230b may be roughened, such as black oxide or brown oxide.

Figure 2J:
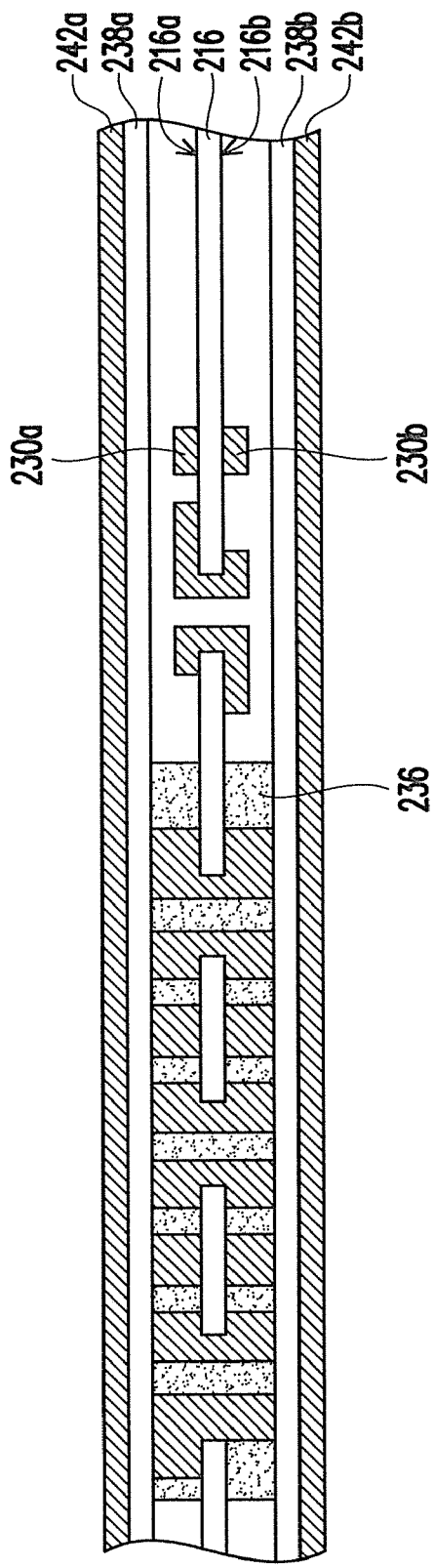

Referring to FIG. 2J, a top dielectric layer 238a and a bottom dielectric layer 238b may be formed after the passive component material 236 is filled. The top dielectric layer 238a covers the patterned top conductive layer 230a and the top surface 216a, and the bottom dielectric layer 238b covers the patterned bottom conductive layer 230b and the bottom surface 216b. Thereafter, a first conductive layer 242a is formed on the top dielectric layer 238a and a second conductive layer 242b is formed on the bottom dielectric layer 238b.

In this embodiment, a method for forming the top dielectric layer 238a, the first conductive layer 242a, the bottom dielectric layer 238b, and the second conductive layer 242b is to respectively compress two resin coated coppers onto the patterned top conductive layer 230a and the top surface 216a and the patterned bottom conductive layer 230b and the bottom surface 216b. Another method is to use prepregs and copper foils, instead of the resin coated copper.

Figure 2K:
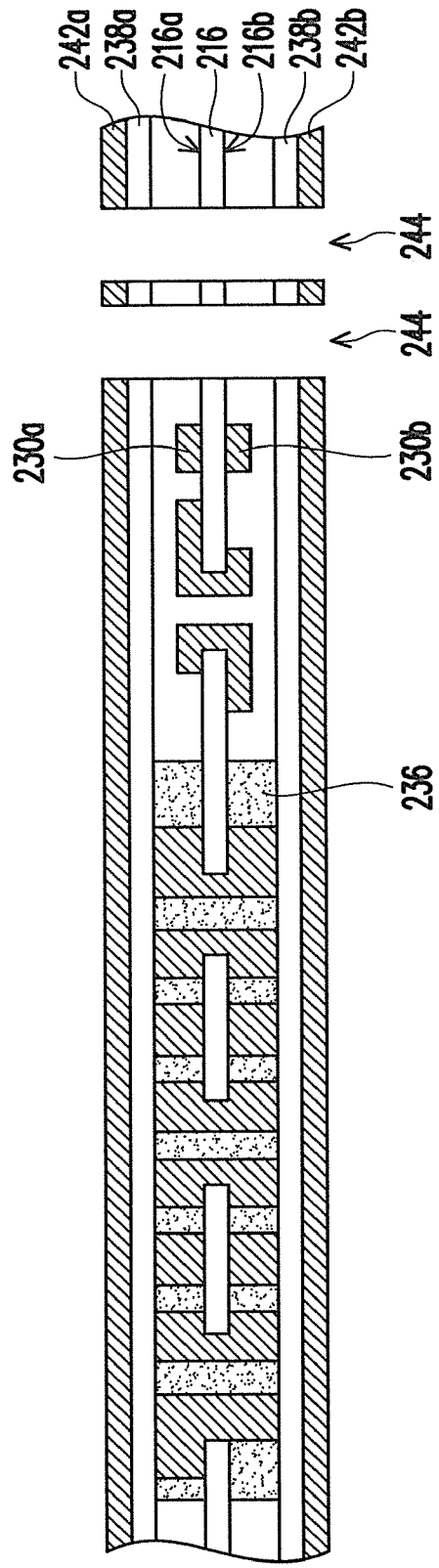

Referring to FIG. 2K, a plurality of through holes 244 is formed between the first conductive layer 242a and the second conductive layer 242b, and the through holes 244 are formed by a driller.

Referring to FIG. 2L, a plurality of first blind holes 246a and a plurality of second blind holes 246b are then formed. The first blind holes 246a extend from the first conductive layer 242a to the patterned top conductive layer 230a, and the second blind holes 246b extend from the second conductive layer 242b to the patterned bottom conductive layer 230b. In addition, the first blind holes 246a and the second blind holes 246b may be formed by laser ablation. A desmear process may be performed on the first blind holes 246a and the second blind holes 246b after the first blind holes 246a and the second blind holes 246b are formed.

Next, referring to FIG. 2M, a conductive wall 248 is formed on the inner wall of each through hole 244, and a plurality of conductive pillars 250 is formed in the first blind holes 246a and the second blind holes 246b. Moreover, the conductive walls 248 and the conductive pillars 250 may be simultaneously formed.

Referring to FIG. 2N, a plurality of fillers 252 may be filled into the through holes 244 after the conductive walls 248 are formed. The fillers 252 may be formed by resin or other suitable insulating materials. In addition, the surfaces of the first conductive layer 242a and the second conductive layer 242b may be polished after the fillers 252 are filled. The aforesaid polishing process may be performed by belt sanding.

Referring to FIGS. 2N and 2O, in this embodiment, the thicknesses of the first conductive layer 242a and the second conductive layer 242b may be increased after the above polishing process is performed, wherein the thicknesses of the first conductive layer 242a and the second conductive layer 242b may be increased by electroplating.

Next, the first conductive layer 242a and the second conductive layer 242b are patterned to respectively form a first patterned conductive layer 254a and a second patterned conductive layer 254b (as shown in FIG. 2O). The first patterned conductive layer 254a and the second patterned conductive layer 254b partially expose the top dielectric layer 238a and the bottom dielectric layer 238b respectively, and the first patterned conductive layer 254a and the second patterned conductive layer 254b comprise a plurality of bonding pads 256a and a plurality of conductive lines 256b. Thereby, a substrate with an embedded passive component is substantially completed.

Additionally, it is noted that in an embodiment not disclosed by the figures, an anti-oxidation layer (for example, a Ni/Au layer) may be formed on each bonding pad 256a. Furthermore, a patterned top solder mask (not shown) may be formed on the first patterned conductive layer 254a and the top dielectric layer 238a, and a patterned bottom solder mask (not shown) may be formed on the second patterned conductive layer 254b and the bottom dielectric layer 238b.

Third Embodiment

Figure 3A:
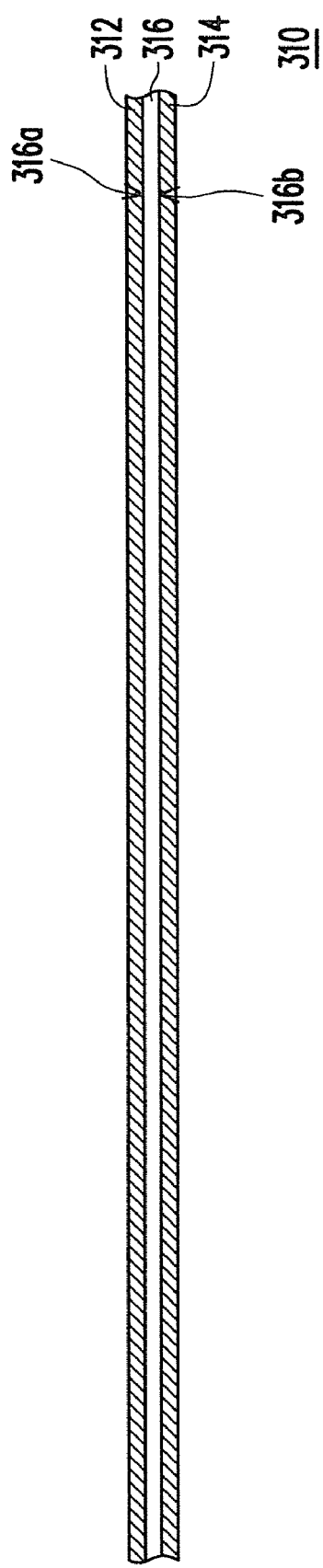
FIGS. 3A to 3U illustrate a fabricating process of a substrate with an embedded passive component according to the third embodiment of the present invention.
Figure 3B:
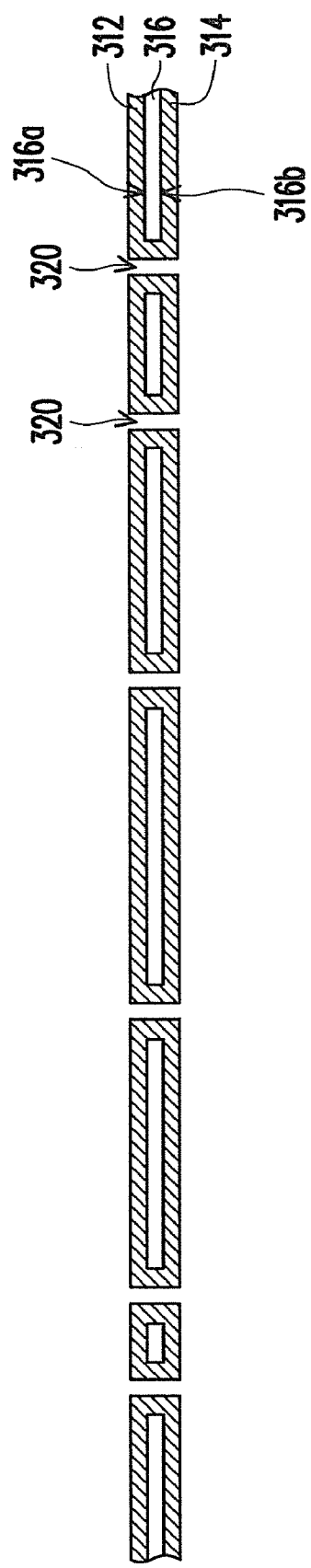
Figure 3C:
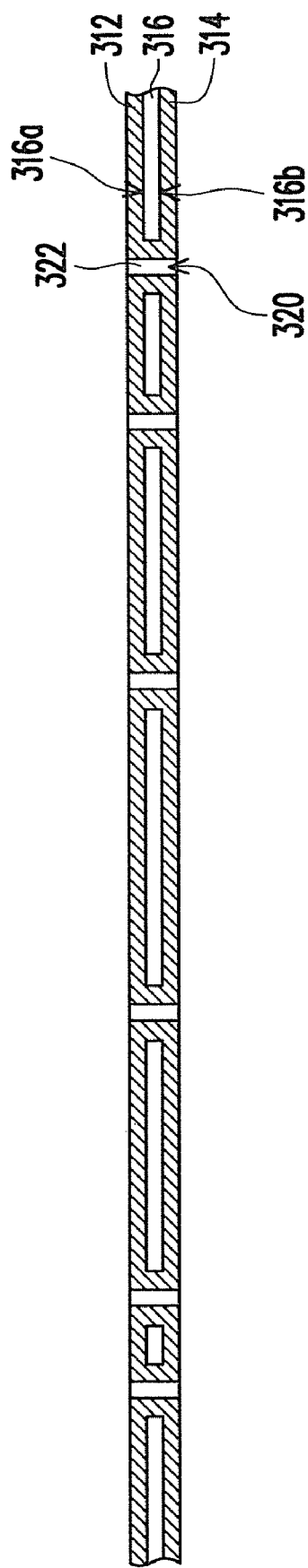
Figure 3D:
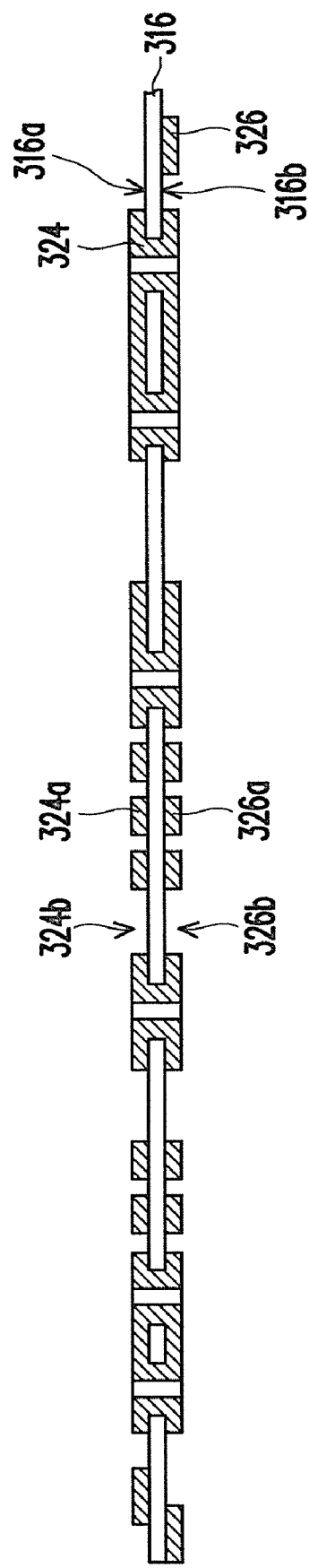
Figure 3M:
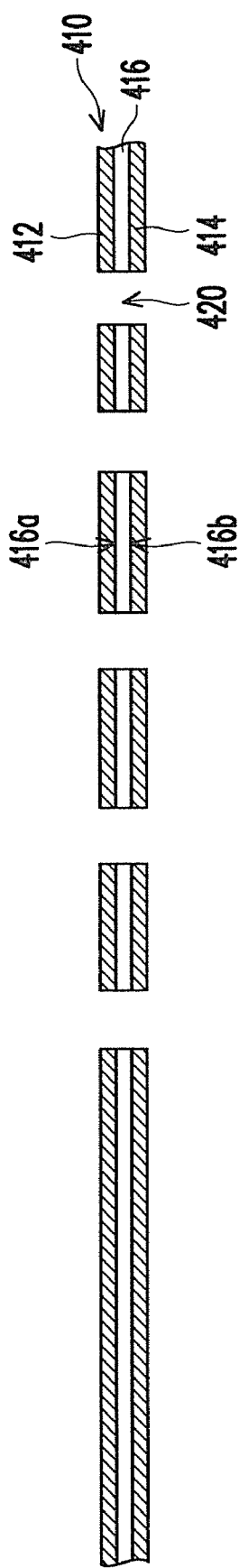
Figure 3N:
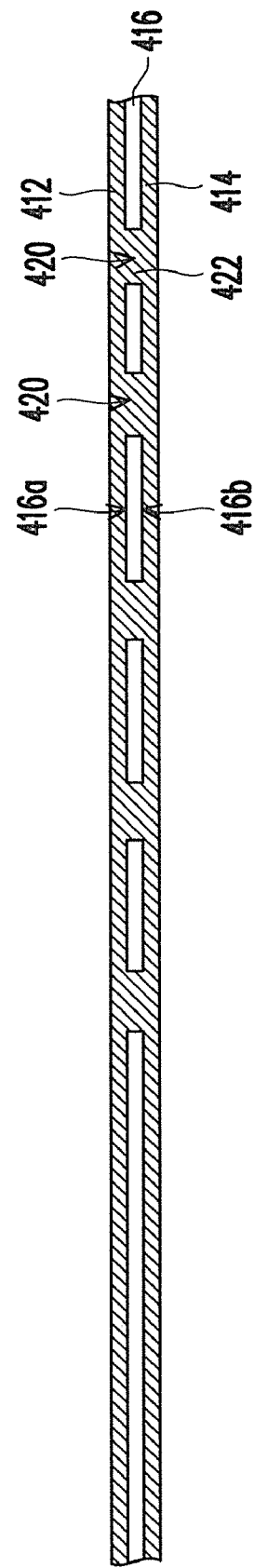
Figure 3O:
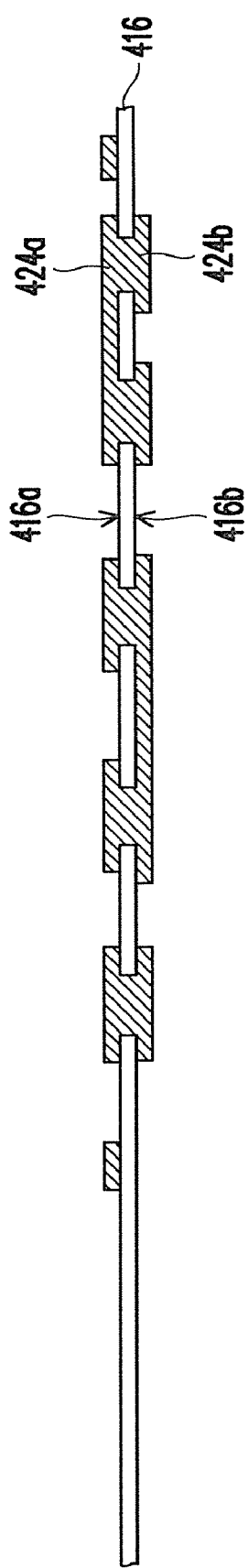
Figure 3P:
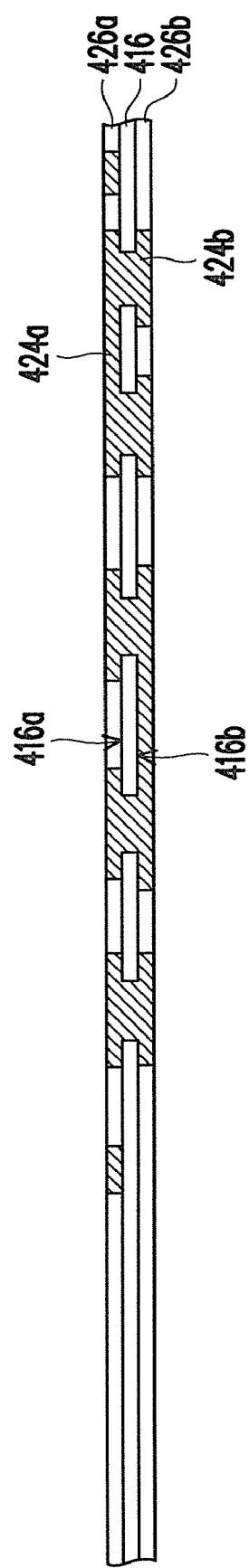
Figure 3Q:
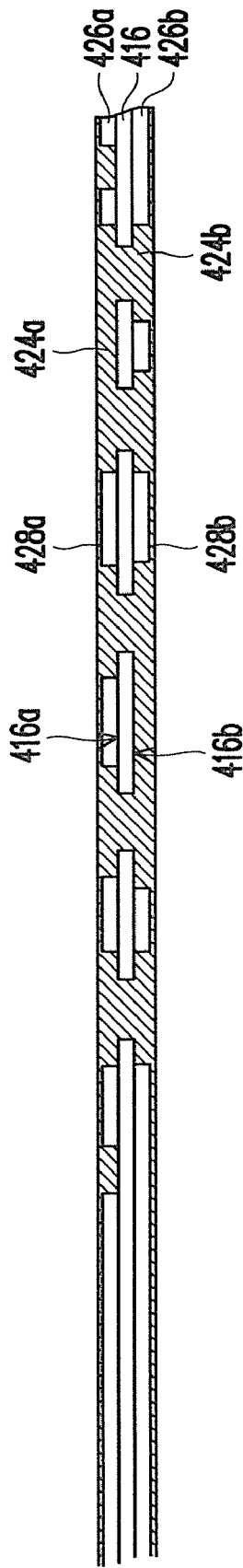
Figure 3R:
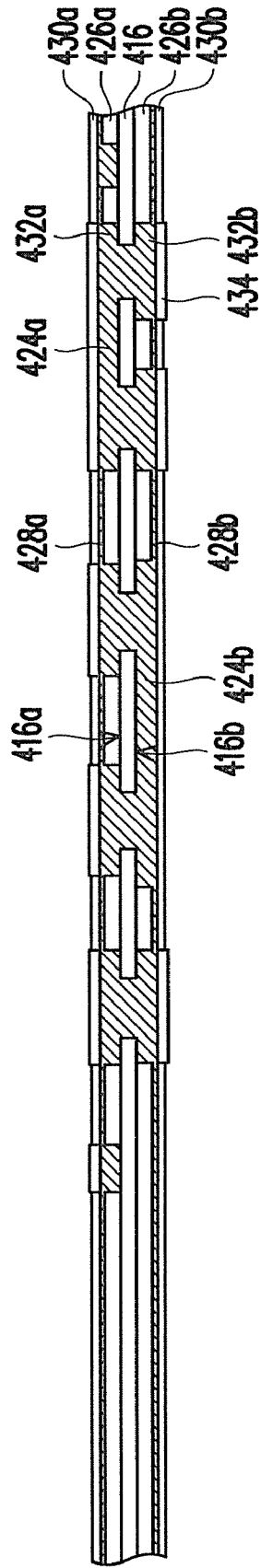
Figure 3S:
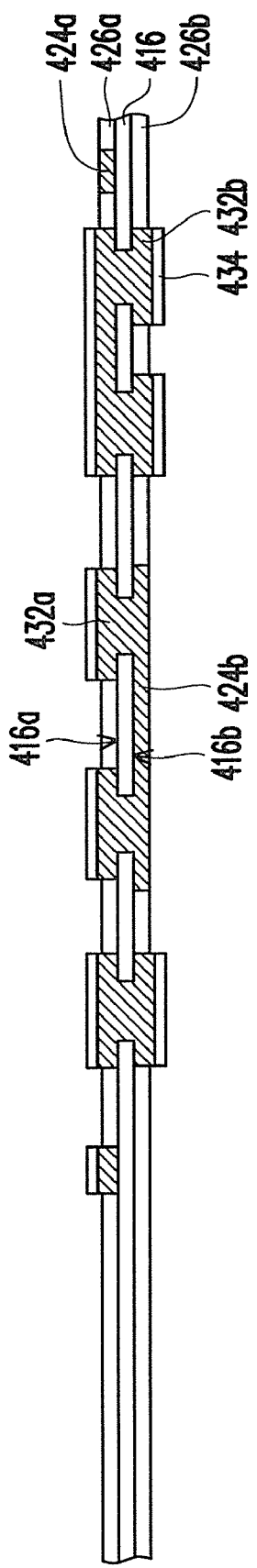
Figure 3T:
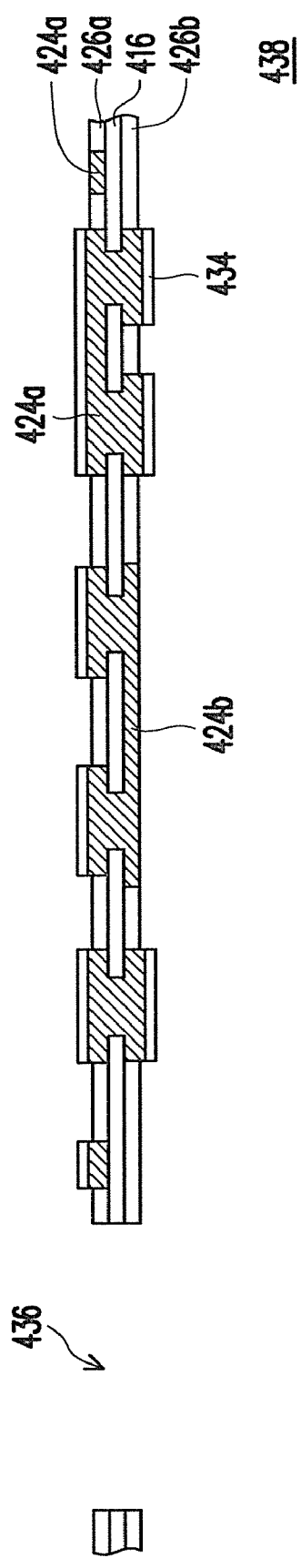
Figure 3U:
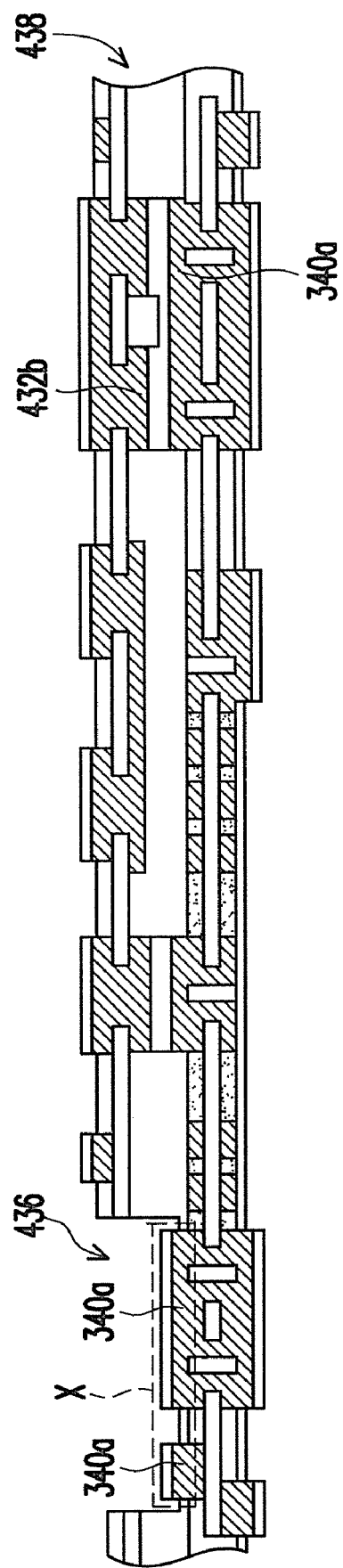

FIGS. 3A to 3U illustrate a fabricating process of a substrate with an embedded passive component according to the third embodiment of the present invention. Referring to FIG. 3A, a substrate 310 is provided first. The substrate 310 comprises a top conductive layer 312, a bottom conductive layer 314, and at least an initial dielectric layer 316 having two opposite surfaces, a top surface 316a and a bottom surface 316b.

Then, referring to FIG. 3B, a plurality of plating through holes 320 is formed on the substrate 310 in FIG. 3A, so as to electrically connect the top conductive layer 312 and the bottom conductive layer 314. Because the structure and fabricating method of the plating through holes 320 are the same as those of the plating through holes 120 and 220 in the aforesaid embodiments, the descriptions thereof are omitted herein.

Referring to FIG. 3C, a plurality of fillers 322 may be filled into the plating through holes 320 after the plating through holes 320 are formed. The fillers 322 may be formed by resin. In addition, after the fillers 322 are filled, the top conductive layer 312 and the bottom conductive layer 314 may be polished to have more even surfaces. The above polishing process may be performed by belt sanding.

Referring to FIG. 3D, after the fillers 322 are filled, the top conductive layer 312 and the bottom conductive layer 314 are patterned to form a patterned top conductive layer 324 and a patterned bottom conductive layer 326. The patterned top conductive layer 324 and the patterned bottom conductive layer 326 respectively comprise a plurality of first traces 324*a* and a plurality of second traces 326*a*. The first traces 324*a* and the second traces 326*a* form a plurality of first trenches 324*b* and a plurality of second trenches 326*b*, and partially expose the top surface 316*a* and the bottom surface 316*b* of the initial dielectric layer 316.

Then, referring to FIG. 3E, a passive component material 328 is filled into the first trenches 324*b* and the second trenches 326*b*, wherein the first traces 324*a*, the second traces 326*a*, and the passive component material 328 form a passive component. The material, shape, and filling method of the passive component material 328 are the same as those of the passive component materials in the aforesaid embodiments. Hence, the descriptions thereof are omitted herein. Additionally, before the passive component material 328 is filled, the patterned top conductive layer 324 and the patterned bottom conductive layer 326 may be roughened, such as black oxide or brown oxide.

Referring to FIG. 3F, a top dielectric layer 330*a* and a first conductive layer 332*a* may be formed after the passive component material 328 is filled. The top dielectric layer 330*a* covers the patterned top conductive layer 324 and the top surface 316*a* of the initial dielectric layer 316, and the first conductive layer 332*a* covers the top dielectric layer 330*a*. A bottom dielectric layer 330*b* and a second conductive layer 332*b* are formed. The bottom dielectric layer 330*b* covers the patterned bottom conductive layer 326 and the bottom surface 316*b* of the initial dielectric layer 316, and the second conductive layer 332*b* covers the bottom dielectric layer 332*b*.

A method for forming the top dielectric layer 330*a*, the bottom dielectric layer 330*b*, the first conductive layer 332*a*, and the second conductive layer 332*b* is to respectively compress two resin coated coppers onto the patterned top conductive layer 324, the top surface 316*a*, the patterned bottom conductive layer 326, and the bottom surface 316*b*.

Thereafter, referring to FIG. 3G, the first conductive layer 332*a*, the second conductive layer 332*b*, a portion of the top dielectric layer 330*a*, and a portion of the bottom dielectric layer 330*b* are removed to expose the patterned top conductive layer 324 and the patterned bottom conductive layer 326. In this embodiment, a method for removing the first conductive layer 332*a* and the second conductive layer 332*b* is to etch and then polish the first conductive layer 332*a* and the second conductive layer 332*b*.

Next, referring to FIG. 3H, a top sealing layer 334*a* and a bottom sealing layer 334*b* are respectively formed on a portion of the patterned top conductive layer 324 and a portion of the patterned bottom conductive layer 326, so as to seal the passive component material 328. The top sealing layer 334*a* and the bottom sealing layer 334*b* may be formed by a thermosetting resin or other suitable materials.

Then, referring to FIG. 3I, a top electroplating seed layer 336*a* and a bottom electroplating seed layer 336*b* are simultaneously formed. The top electroplating seed layer 336*a* covers the top sealing layer 334*a*, the patterned top conductive layer 324, and the top surface 316*a* of the initial dielectric layer 316. The bottom electroplating seed layer 336*b* covers the bottom sealing layer 334*b*, the patterned bottom conductive layer 326, and the bottom surface 316*b* of the initial dielectric layer 316. The top electroplating seed layer 336*a* and the bottom electroplating seed layer 336*b* may be formed by electroless plating.

Thereafter, a patterned top anti-plating layer 338*a* and a patterned bottom anti-plating layer 338*b* are respectively formed on the top electroplating seed layer 336*a* and the bottom electroplating seed layer 336*b*. The patterned top anti-plating layer 338*a* partially exposes the top electroplating seed layer 336*a* and the patterned bottom anti-plating layer 338*b* partially exposes the bottom electroplating seed layer 336*b*. The patterned top anti-plating layer 338*a* and the patterned bottom anti-plating layer 338*b* may be photo-resist layers after exposure and development.

Following that, referring to FIG. 3J, the top electroplating seed layer 336*a* and the bottom electroplating seed layer 336*b* partially exposed by the patterned top anti-plating layer 338*a* and the patterned bottom anti-plating layer 338*b* are electroplated, so as to form a plurality of top bonding pads 340*a* and a plurality of bottom bonding pads 340*b*. Then, the patterned top anti-plating layer 338*a* and the patterned bottom anti-plating layer 338*b* are removed, as shown in FIG. 3K.

Referring to FIGS. 3J and 3K, a plurality of anti-oxidation layers 342 may be further formed on the top bonding pads 340*a* and the bottom bonding pads 340*b* before the patterned top anti-plating layer 338*a* and the patterned bottom anti-plating layer 338*b* are removed. A material of the anti-oxidation layers 342 may be nickel or gold, and the anti-oxidation layers 342 may be formed by electroplating.

Referring to FIG. 3L, a portion of the top electroplating seed layer 336*a* and a portion of the bottom electroplating seed layer 336*b* are then removed to expose the top dielectric layer 330*a* and the bottom dielectric layer 330*b*. A method for removing the portion of the top electroplating seed layer 336*a* and the portion of the bottom electroplating seed layer 336*b* is to perform micro-etching on the top electroplating seed layer 336*a* and the bottom electroplating seed layer 336*b*. Thereafter, a top patterned solder mask 344*a* and a bottom patterned solder mask 344*b* are formed. The top patterned solder mask 344*a* covers the patterned top conductive layer 324 and the top surface 316*a* of the initial dielectric layer 316, and exposes the top bonding pads 340*a*. The bottom patterned solder mask 344*b* covers the patterned bottom conductive layer 326 and the bottom surface 316*b* of the initial dielectric layer 316, and exposes the bottom bonding pads 340*b*. Thereby, a substrate with an embedded passive component is approximately completed.

Additionally, according to the requirement of the products, the top patterned solder mask 344*a* and the bottom patterned solder mask 344*b* may be formed again thereafter. Then, an additional circuit panel (referring to the following paragraphs for detailed descriptions) is compressed onto the top patterned solder mask 344*a* and the top bonding pads 340*a*.

Referring to FIG. 3M, a method for fabricating the additional circuit panel may comprise the following steps. First, a panel 410 comprising an additional top conductive layer 412, an additional bottom conductive layer 414, and at least an additional dielectric layer 416 is provided. The additional dielectric layer 416 has two opposite surfaces, a top surface 416*a* and a bottom surface 416*b*. The additional top conductive layer 412 and the additional bottom conductive layer 414 are separately disposed on the top surface 416a and the bottom surface 416b. Moreover, the panel 410 comprises a plurality of through holes 420 extending from the additional top conductive layer 412 to the additional bottom conductive layer 414. The through holes 420 may be formed by a driller.

Then, referring to FIG. 3N, a plurality of conductive pillars 422 is formed in the through holes 420. The conductive pillars 422 may be formed by electroplating. In addition, the additional top conductive layer 412 is electrically connected with the additional bottom conductive layer 414 by the conductive pillars 422. Referring to FIG. 3O, the additional top conductive layer 412 and the additional bottom conductive layer 414 are patterned to respectively form an additional patterned top conductive layer 424a and an additional patterned bottom conductive layer 424b. The additional patterned top conductive layer 424a and the additional patterned bottom conductive layer 424b partially expose the top surface 416a and the bottom surface 416b of the additional dielectric layer 416 respectively.

Thereafter, referring to FIG. 3P, a first patterned solder mask 426a and a second patterned solder mask 426b are separately formed on the partially exposed top surface 416a and bottom surface 416b.

Next, referring to FIG. 3Q, a first additional electroplating layer 428a and a second additional electroplating layer 428b are simultaneously formed. The first additional electroplating layer 428a covers the first patterned solder mask 426a and the additional patterned top conductive layer 424a, and the second additional electroplating layer 428b covers the second patterned solder mask 426b and the additional patterned bottom conductive layer 424b. The first additional electroplating layer 428a and the second additional electroplating layer 428b may be formed by electroless plating.

Then, referring to FIG. 3R, a patterned top photo-resist layer 430a and a patterned bottom photo-resist layer 430b are formed on the first additional electroplating layer 428a and the second additional electroplating layer 428b separately. The patterned top photo-resist layer 430a partially exposes the first additional electroplating layer 428a to form a plurality of first bonding pads 432a, and the patterned bottom photo-resist layer 430b partially exposes the second additional electroplating layer 428b to form a plurality of second bonding pads 432b. The patterned top photo-resist layer 430a and the patterned bottom photo-resist layer 430b may be formed by photolithography.

Thereafter, a plurality of anti-oxidation layers 434 is separately on the first bonding pads 432a and the second bonding pads 432b. A method for forming the anti-oxidation layers 434 may be the same as the method for forming the anti-oxidation layers 342 in FIG. 3K.

Referring to FIG. 3S, the patterned top photo-resist layer 430a and the patterned bottom photo-resist layer 430b are removed after the anti-oxidation layers 434 are formed. Following that, a portion of the first additional electroplating layer 428a and a portion of the second additional electroplating layer 428b are removed to expose the first patterned solder mask 426a and the second patterned solder mask 426b.

Referring to FIG. 3T, a through groove 436 may be formed thereafter. The through groove 436 may be formed by grooving. Thereby, an additional circuit panel 438 is substantially completed.

Referring to FIG. 3U, the additional circuit panel 438 is then compressed. Because the additional circuit panel 438 comprises a plurality of second bonding pads 432b corresponding to the top bonding pads 340a, the top bonding pads 340a and the second bonding pads 432b are bonded during the compression. Moreover, the through groove 436 exposes at least one top bonding pad 340a (two top bonding pads 340a are illustrated in FIG. 3U), as indicated by X in FIG. 3U. The top bonding pads 340a in the X may serve as chip bonding pads for connecting with a chip.

Fourth Embodiment

Figure 4A:
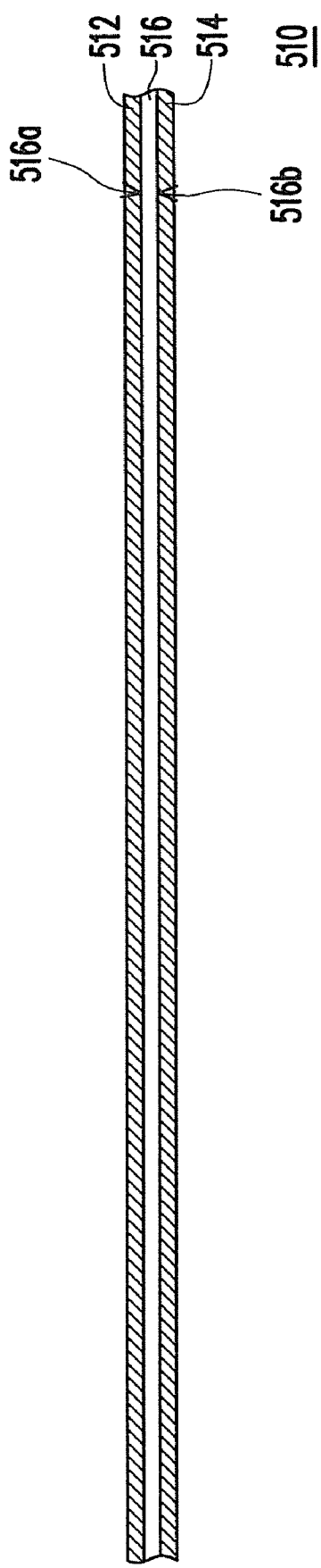

FIGS. 4A to 4M illustrate a fabricating process of a substrate with an embedded passive component according to the fourth embodiment of the present invention. Referring to FIG. 4A, a substrate 510 is provided first. The substrate 510 comprises a top conductive layer 512, a bottom conductive layer 514, and at least an initial dielectric layer 516 having two opposite surfaces, a top surface 516a and a bottom surface 516b.

Figure 4B:
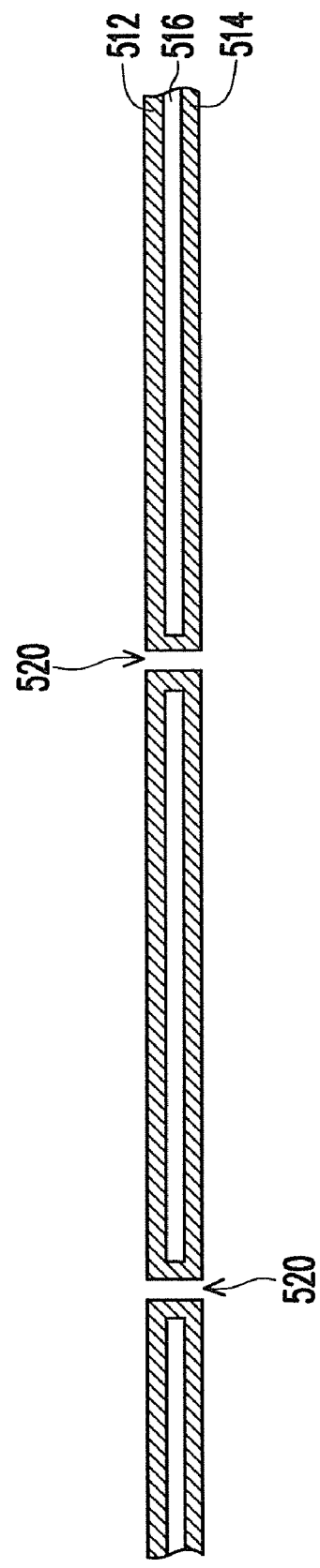

Then, referring to FIG. 4B, a plurality of plating through holes 520 is formed on the substrate 510, so as to electrically connect the top conductive layer 512 and the bottom conductive layer 514. Because the structure and fabricating method of the plating through holes 520 are the same as those of the plating through holes 120 and 220 in the aforesaid embodiments, the descriptions thereof are omitted herein.

Next, referring to FIG. 4C, the top conductive layer 512 and the bottom conductive layer 514 (referring to FIG. 4B) are patterned to respectively form a patterned top conductive layer 524 and a patterned bottom conductive layer 526. The top conductive layer 512 and the bottom conductive layer 514 may be patterned by performing photolithography and etching.

The patterned top conductive layer 524 comprises a plurality of first traces 524a and the patterned bottom conductive layer 526 comprises a plurality of second traces 526a. The first traces 524a partially expose the top surface 516a of the initial dielectric layer 516 and the second traces 526a partially expose the bottom surface 516b, wherein a portion of the first traces 524a forms a plurality of first trenches 524b and a portion of the second traces 526a forms a plurality of second trenches 526b.

Then, referring to FIG. 4D, a passive component material 528 is filled into the first trenches 524b and the second trenches 526b, wherein the first traces 524a, the second traces 526a, and the passive component material 528 form a passive component. The material, shape, and filling method of the passive component material 528 are the same as those of the passive component materials in the aforesaid embodiments. Hence, the descriptions thereof are omitted herein. Moreover, before the passive component material 528 is filled, the patterned top conductive layer 524 and the patterned bottom conductive layer 526 may be roughened, such as black oxide or brown oxide.

Referring to FIG. 4E, after the passive component material 528 is filled into the first trenches 524b and the second trenches 526b, a sealing layer 530 may be further formed on a portion of the patterned bottom conductive layer 526 to seal the passive component material 528 inside the patterned bottom conductive layer 526. The sealing layer 530 may be formed by a thermosetting resin or other suitable resins.

According to the requirement of the products, an additional circuit panel (referring to the following paragraphs for detailed descriptions) may be compressed onto the patterned top conductive layer 524 after the sealing layer 530 is formed.

Referring to FIG. 4F, a method for fabricating the additional circuit panel may comprise the following steps. First, a panel 610 comprising an additional top conductive layer 612, an additional bottom conductive layer 614, and at least an additional dielectric layer 616 is provided. The additional dielectric layer 616 comprises two opposite surfaces, a top surface 616a and a bottom surface 616b. The additional top conductive layer 612 and the additional bottom conductive layer 614 are separately disposed on the top surface 616a and the bottom surface 616b.

Figure 4G:
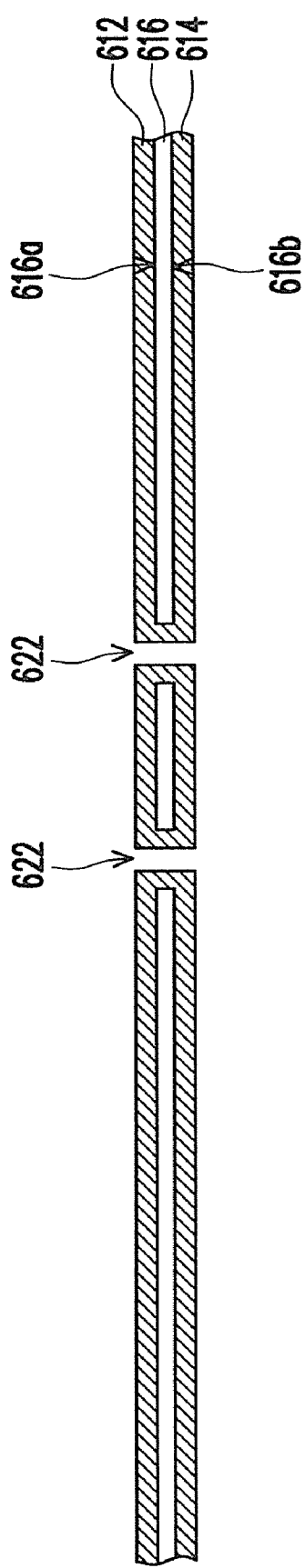

Referring to FIG. 4G, a plurality of additional plating through holes 622 is formed thereafter. The additional plating through holes 622 may be formed by electroplating. Thereby, the additional top conductive layer 612 may be electrically connected with the additional bottom conductive layer 614 by the additional plating through holes 622.

Figure 4H:
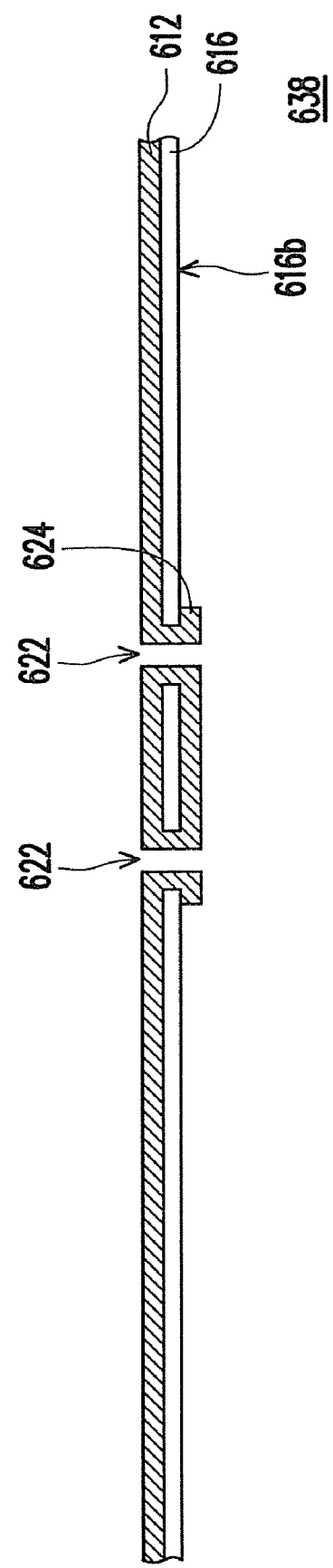

Referring to FIG. 4H, the additional bottom conductive layer 614 is patterned to form an additional patterned bottom conductive layer 624. The additional patterned bottom conductive layer 624 exposes the bottom surface 616b of the additional dielectric layer 616 in part. Accordingly, an additional circuit panel 638 is approximately completed. Furthermore, after the additional patterned bottom conductive layer 624 is formed, the additional top conductive layer 612 and the additional patterned bottom conductive layer 624 may be roughened, such as black oxide or brown oxide.

Following that, referring to FIG. 4I, the additional circuit panel 638 is compressed onto the patterned top conductive layer 524. The additional patterned bottom conductive layer 624 is arranged between the patterned top conductive layer 524 and the additional top conductive layer 612 when the additional circuit panel 638 is compressed. In this embodiment, the additional circuit panel 638 is compressed onto the patterned top conductive layer 524 through a prepreg 640.

Referring to FIG. 4J, a plurality of plating through holes 620 is then formed, wherein the plating through holes 620 are connected between the additional top conductive layer 612 and the patterned bottom conductive layer 526. The plating through holes 620 may be hollow conductive pillars. Hence, a plurality of fillers 626 may be filled into the plating through holes 620 after the plating through holes 620 are formed.

The fillers 626 may be formed by resin or other suitable insulating materials. Moreover, the surfaces of the additional top conductive layer 612 and the patterned bottom conductive layer 526 may be polished after the fillers 626 are filled. The aforesaid polishing process may be performed by belt sanding.

As shown in FIG. 4K, the thicknesses of the additional top conductive layer 612 and the patterned bottom conductive layer 526 may be increased when the plating through holes 620 are formed. The methods for forming the plating through holes 620 and increasing the thicknesses of the additional top conductive layer 612 and the patterned bottom conductive layer 526 comprise electroplating.

After the thicknesses of the additional top conductive layer 612 and the patterned bottom conductive layer 526 are increased, the patterned bottom conductive layer 526 covers the sealing layer 530. Further, the fillers 626 are sealed by the patterned bottom conductive layer 526 and the additional top conductive layer 612.

Thereafter, referring to FIGS. 4K and 4L, the additional top conductive layer 612 is patterned to form a first patterned conductive layer 630a partially exposing the additional dielectric layer 616, and the patterned bottom conductive layer 526 is patterned to form a second patterned conductive layer 630b partially exposing the initial dielectric layer 516.

The first patterned conductive layer 630a comprises a plurality of top bonding pads 632a, and the second patterned conductive layer 630b comprises a plurality of bottom bonding pads 632b. In addition, the additional top conductive layer 612 and the patterned bottom conductive layer 526 may be patterned by photolithography and etching. Thereby, a substrate with an embedded passive component is approximately completed.

Figure 4M:
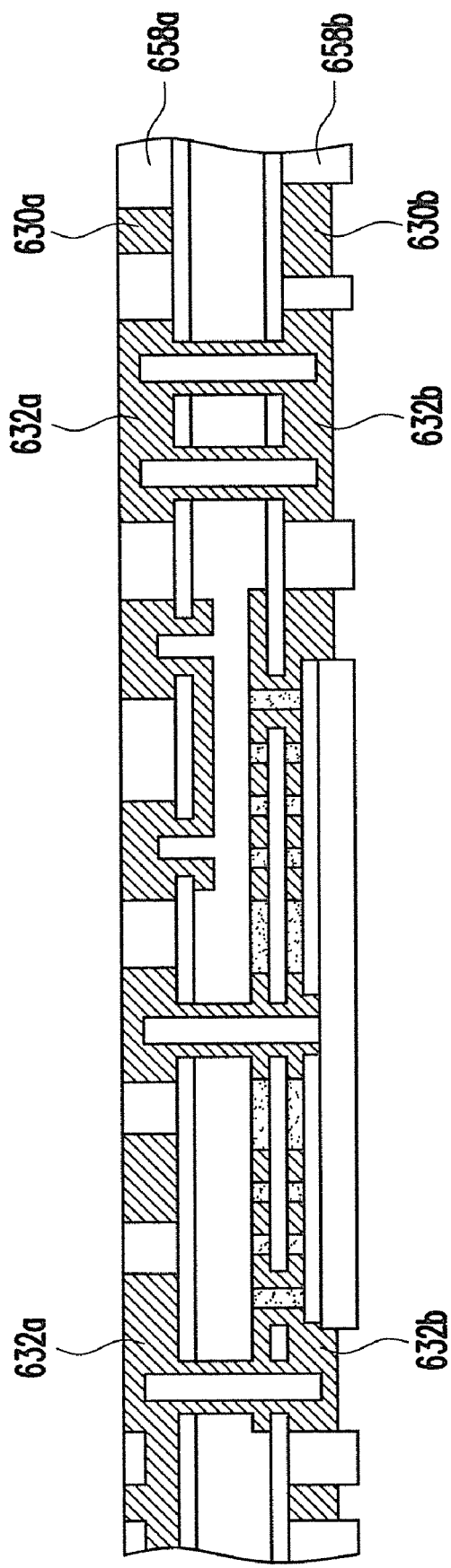

Following that, referring to FIG. 4M, a patterned top solder mask 658a may be formed on the first patterned conductive layer 630a, and a patterned bottom solder mask 658b may be formed on the second patterned conductive layer 630b. The patterned top solder mask 658a exposes the top bonding pads 632a, and the patterned bottom solder mask 658b exposes the bottom bonding pads 632b. After the patterned top solder mask 658a and the patterned bottom solder mask 658b are formed, the substrate with the embedded passive component is basically completed.

To conclude, the present invention makes use of the first traces, the second traces, and the passive component material filled into the first trenches and the second trenches to form the embedded passive component. Thereby, the requirement of circuit design can be fulfilled.

Although the present invention has been disclosed by the above embodiments, they are not intended to limit the present invention. Anybody with ordinary knowledge in the field may make modifications and alterations without departing from the spirit and scope of the present invention. Therefore, the protection range of the present invention falls in the appended claims.

What is claimed is:

1. A process for fabricating a substrate with an embedded passive component, comprising:
    providing a substrate comprising a top conductive layer, a bottom conductive layer, and at least an initial dielectric layer having a top surface and a bottom surface opposite to the top surface, the top conductive layer and the bottom conductive layer being respectively disposed on the top surface and the bottom surface;
    forming a plurality of plating through holes in the substrate;
    patterning the top conductive layer and the bottom conductive layer to respectively form a patterned top conductive layer comprising a plurality of first traces and a patterned bottom conductive layer comprising a plurality of second traces after the plating through holes are formed, wherein a portion of the first traces forms a plurality of first trenches, a portion of the second traces forms a plurality of second trenches, and the first traces and the second traces partially expose the top surface and the bottom surface respectively;
    filling a passive component material into the first trenches and the second trenches, wherein the first traces, the second traces, and the passive component material are adapted for forming a passive component;
    forming a sealing layer on a portion of the patterned bottom conductive layer to seal the passive component material inside the patterned bottom conductive layer after the passive component material is filled into the first trenches and the second trenches;
    after forming the sealing layer, forming a first dielectric layer to cover the top surface of the initial dielectric layer and the patterned top conductive layer;
    forming a first conductive layer on the first dielectric layer;
    forming a plurality of first blind holes extending from the first conductive layer to the patterned top conductive layer;
    forming a plurality of first conductive pillars in the first blind holes; and
    patterning the first conductive layer to form a first patterned conductive layer partially exposing the first dielectric layer.

2. The fabricating process as claimed in claim 1, wherein the passive component material comprises a ferrimagnetic material.

3. The fabricating process as claimed in claim 1, wherein the passive component material is filled into the first trenches and the second trenches by printing.

4. The fabricating process as claimed in claim 1, wherein a material of the sealing layer is a thermosetting resin.

5. The fabricating process as claimed in claim 1, wherein a method for forming the first conductive pillars comprises:
    forming a first seed layer on an inner wall of each first blind hole to connect between the patterned top conductive layer and the first conductive layer; and
    electroplating the first seed layers.

6. The fabricating process as claimed in claim 5, wherein a thickness of the patterned bottom conductive layer is increased and the patterned bottom conductive layer covers the sealing layer when the first conductive pillars are formed.

7. The fabricating process as claimed in claim 1, after the first patterned conductive layer is formed, further comprising:
    forming a second dielectric layer to cover the first dielectric layer and the first patterned conductive layer;
    forming a second conductive layer on the second dielectric layer;
    forming a plurality of second blind holes extending from the second conductive layer to the first patterned conductive layer;
    forming a plurality of second conductive pillars in the second blind holes; and
    patterning the second conductive layer and the patterned bottom conductive layer to respectively form a second patterned conductive layer and a twice-patterned bottom conductive layer after the second conductive pillars are formed, wherein the second patterned conductive layer partially exposes the second dielectric layer and the twice-patterned bottom conductive layer exposes the sealing layer and a portion of the initial dielectric layer.

8. The fabricating process as claimed in claim 7, wherein the second patterned conductive layer and the twice-patterned bottom conductive layer comprise a plurality of bonding pads and a plurality of traces.

9. The fabricating process as claimed in claim 8, after the second patterned conductive layer and the twice-patterned bottom conductive layer are formed, further comprising:
    forming a patterned top solder mask on the second patterned conductive layer and the second dielectric layer; and
    forming a patterned bottom solder mask on the twice-patterned bottom conductive layer, the initial dielectric layer, and the sealing layer, wherein the patterned top solder mask and the patterned bottom solder mask expose the bonding pads.

10. The fabricating process as claimed in claim 1, wherein the substrate is divided into a first zone and a second zone, the patterned top conductive layer comprises a first patterned top conductive layer and a second patterned top conductive layer, the patterned bottom conductive layer comprises a first patterned bottom conductive layer and a second patterned bottom conductive layer, the first patterned top conductive layer and the first patterned bottom conductive layer are in the first zone, and the second patterned top conductive layer and the second patterned bottom conductive layer are in the second zone.

11. The fabricating process as claimed in claim 10, wherein a method for forming the patterned top conductive layer and the patterned bottom conductive layer comprises:
    patterning the top conductive layer and the bottom conductive layer in the first zone to respectively form the first patterned top conductive layer and the first patterned bottom conductive layer respectively exposing the top surface and the bottom surface of the initial dielectric layer partially;
    forming a top electroplating seed layer and a bottom electroplating seed layer, wherein the top electroplating seed layer covers the first patterned top conductive layer and the top surface partially exposed by the first patterned top conductive layer, and the bottom electroplating seed layer covers the first patterned bottom conductive layer and the bottom surface partially exposed by the first patterned bottom conductive layer;
    forming a top anti-plating layer covering the first patterned top conductive layer and the top electroplating seed layer, and a bottom anti-plating layer covering the first patterned bottom conductive layer and the bottom electroplating seed layer, wherein a thickness of the top anti-plating layer is larger than a thickness of the top conductive layer and a thickness of the bottom anti-plating layer is larger than a thickness of the bottom conductive layer;
    increasing the thicknesses of the top conductive layer and the bottom conductive layer in the second zone by electroplating after the top anti-plating layer and the bottom anti-plating layer are formed, so that the thickness of the top conductive layer is equal to/larger than the thickness of the top anti-plating layer and the thickness of the bottom conductive layer is equal to/larger than the thickness of the bottom anti-plating layer;
    removing the top anti-plating layer and the bottom anti-plating layer;
    removing a portion of the top electroplating seed layer and a portion of the bottom electroplating seed layer; and
    the top conductive layer and the bottom conductive layer in the second zone are patterned to respectively form the second patterned top conductive layer and the second patterned bottom conductive layer after the thicknesses of the top conductive layer and the bottom conductive layer in the second zone are increased, wherein the second patterned top conductive layer comprises the first trenches and the second patterned bottom conductive layer comprises the second trenches.

12. The fabricating process as claimed in claim 11, after the passive component material is filled, further comprising:
    forming a top dielectric layer to cover the patterned top conductive layer and the top surface of the initial dielectric layer;
    forming a bottom dielectric layer to cover the patterned bottom conductive layer and the bottom surface of the initial dielectric layer;
    forming a first conductive layer on the top dielectric layer;
    forming a second conductive layer on the bottom dielectric layer;
    forming a plurality of through holes between the first conductive layer and the second conductive layer;
    forming a plurality of first blind holes extending from the first conductive layer to the patterned top conductive layer;
    forming a plurality of second blind holes extending from the second conductive layer to the patterned bottom conductive layer;
    forming a plurality of conductive pillars in the first blind holes and the second blind holes;
    forming a conductive wall on an inner wall of each through hole; and
    patterning the first conductive layer and the second conductive layer to respectively form a first patterned conductive layer and a second patterned conductive layer, wherein the first patterned conductive layer and the second patterned conductive layer partially expose the top dielectric layer and the bottom dielectric layer respectively.

13. The fabricating process as claimed in claim 12, wherein the first patterned conductive layer and the second patterned conductive layer comprise a plurality of bonding pads and a plurality of traces.

14. The fabricating process as claimed in claim 1, further comprising filling a plurality of fillers in the plating through holes after the plating through holes are formed.

15. The fabricating process as claimed in claim 14, after the passive component material is filled, further comprising:
- forming a top dielectric layer to cover the patterned top conductive layer and the top surface of the initial dielectric layer;
- forming a bottom dielectric layer to cover the patterned bottom conductive layer and the bottom surface of the initial dielectric layer;
- forming a first conductive layer on the top dielectric layer;
- forming a second conductive layer on the bottom dielectric layer;
- removing the first conductive layer, the second conductive layer, a portion of the top dielectric layer, and a portion of the bottom dielectric layer to expose the patterned top conductive layer and the patterned bottom conductive layer;
- respectively forming a top sealing layer and a bottom sealing layer on a portion of the patterned top conductive layer and a portion of the patterned bottom conductive layer to seal the passive component material;
- simultaneously forming a top electroplating seed layer covering the top sealing layer, the patterned top conductive layer, and the top surface of the initial dielectric layer, and a bottom electroplating seed layer covering the bottom sealing layer, the patterned bottom conductive layer, and the bottom surface of the initial dielectric layer;
- separately forming a patterned top anti-plating layer and a patterned bottom anti-plating layer on the top electroplating seed layer and the bottom electroplating seed layer, wherein the patterned top anti-plating layer partially exposes the top electroplating seed layer and the patterned bottom anti-plating layer partially exposes the bottom electroplating seed layer;
- electroplating the top electroplating seed layer partially exposed by the patterned top anti-plating layer to form a plurality of top bonding pads;
- electroplating the bottom electroplating seed layer partially exposed by the patterned bottom anti-plating layer to form a plurality of bottom bonding pads;
- removing the patterned top anti-plating layer and the patterned bottom anti-plating layer;
- removing a portion of the top electroplating seed layer and a portion of the bottom electroplating seed layer to expose the top dielectric layer and the bottom dielectric layer;
- forming a top patterned solder mask on the patterned top conductive layer and the top surface of the initial dielectric layer, and exposing the top bonding pads; and
- forming a bottom patterned solder mask on the patterned bottom conductive layer and the bottom surface of the initial dielectric layer, and exposing the bottom bonding pads.

16. The fabricating process as claimed in claim 15, wherein a material of the top sealing layer and the bottom sealing layer is a thermosetting resin.

17. The fabricating process as claimed in claim 15, further comprising compressing an additional circuit panel onto the top patterned solder mask and the top bonding pads after the top patterned solder mask and the bottom patterned solder mask are formed, the additional circuit panel comprising a plurality of second bonding pads corresponding to the top bonding pads for being bonded with the top bonding pads when the additional circuit panel is compressed.

18. The fabricating process as claimed in claim 17, wherein a method for fabricating the additional circuit panel comprises:
- providing a panel comprising an additional top conductive layer, an additional bottom conductive layer, and at least an additional dielectric layer having a top surface and a bottom surface opposite to the top surface, the additional top conductive layer and the additional bottom conductive layer being respectively disposed on the top surface and the bottom surface, and the panel comprising a plurality of through holes extending from the additional top conductive layer to the additional bottom conductive layer;
- forming a plurality of conductive pillars in the through holes;
- patterning the additional top conductive layer and the additional bottom conductive layer to respectively form an additional patterned top conductive layer and an additional patterned bottom conductive layer, wherein the additional patterned top conductive layer and the additional patterned bottom conductive layer partially expose the top surface and the bottom surface of the additional dielectric layer separately;
- forming a first patterned solder mask on the top surface of the additional dielectric layer exposed by the additional patterned top conductive layer;
- forming a second patterned solder mask on the bottom surface of the additional dielectric layer exposed by the additional patterned bottom conductive layer;
- simultaneously forming a first additional electroplating layer covering the first patterned solder mask and the additional patterned top conductive layer, and a second additional electroplating layer covering the second patterned solder mask and the additional patterned bottom conductive layer;
- respectively forming a patterned top photo-resist layer and a patterned bottom photo-resist layer on the first additional electroplating layer and the second additional electroplating layer, wherein the patterned top photo-resist layer partially exposes the first additional electroplating layer to form a plurality of first bonding pads and the patterned bottom photo-resist layer partially exposes the second additional electroplating layer to form a plurality of second bonding pads;
- separately forming a plurality of anti-oxidation layers on the first bonding pads and the second bonding pads;
- removing the patterned top photo-resist layer and the patterned bottom photo-resist layer after the anti-oxidation layers are formed; and
- removing a portion of the first additional electroplating layer and a portion of the second additional electroplating layer to expose the first patterned solder mask and the second patterned solder mask.

19. The fabricating process as claimed in claim 17, further comprising forming a through groove on the additional circuit panel, the top bonding pads comprising at least a chip bonding pad exposed by the through groove.

20. The fabricating process as claimed in claim 1, after the sealing layer is formed, further comprising:

compressing an additional circuit panel onto the patterned top conductive layer, wherein the additional circuit panel comprises an additional top conductive layer, an additional patterned bottom conductive layer, and an additional dielectric layer disposed between the additional top conductive layer and the additional patterned bottom conductive layer, and the additional patterned bottom conductive layer is between the patterned top conductive layer and the additional top conductive layer when the additional circuit panel is compressed;

forming a plurality of plating through holes connecting between the additional top conductive layer and the patterned bottom conductive layer;

patterning the additional top conductive layer to form a first patterned conductive layer partially exposing the additional dielectric layer, wherein the first patterned conductive layer comprises a plurality of top bonding pads; and patterning the patterned bottom conductive layer to form a second patterned conductive layer partially exposing the initial dielectric layer, wherein the second patterned conductive layer comprises a plurality of bottom bonding pads.

21. The fabricating process as claimed in claim 20, further comprising increasing a thickness of the additional top conductive layer and a thickness of the patterned bottom conductive layer when the plating through holes are formed, wherein the patterned bottom conductive layer covers the sealing layer after the thickness thereof is increased.

22. The fabricating process as claimed in claim 21, further comprising:

forming a patterned top solder mask on the first patterned conductive layer, wherein the patterned top solder mask exposes the top bonding pads; and forming a patterned bottom solder mask on the second patterned conductive layer, wherein the patterned bottom solder mask exposes the bottom bonding pads.

23. The fabricating process as claimed in claim 20, wherein the method for fabricating the additional circuit panel comprises:

providing a panel comprising the additional top conductive layer, an additional bottom conductive layer, and the additional dielectric layer having a top surface and a bottom surface opposite to the top surface, the additional top conductive layer and the additional bottom conductive layer being disposed on the top surface and the bottom surface respectively;

forming a plurality of additional plating through holes; and patterning the additional bottom conductive layer to form the additional patterned bottom conductive layer, wherein the additional patterned bottom conductive layer partially exposes the bottom surface of the additional dielectric layer.

24. The fabricating process as claimed in claim 20, wherein the additional circuit panel is compressed onto the patterned top conductive layer through a prepreg.

* * * * *